(12) United States Patent
Ohmi et al.

(10) Patent No.: US 7,887,385 B2
(45) Date of Patent: Feb. 15, 2011

(54) ORGANIC EL LIGHT EMITTING ELEMENT, MANUFACTURING METHOD THEREOF, AND DISPLAY DEVICE

(75) Inventors: Tadahiro Ohmi, Miyagi (JP); Akinobu Teramoto, Miyagi (JP); Akihiro Morimoto, Miyagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 959 days.

(21) Appl. No.: 11/663,560

(22) PCT Filed: Sep. 24, 2004

(86) PCT No.: PCT/JP2004/014424

§ 371 (c)(1),
(2), (4) Date: Apr. 16, 2007

(87) PCT Pub. No.: WO2006/033166

PCT Pub. Date: Mar. 30, 2006

(65) Prior Publication Data
US 2008/0054795 A1    Mar. 6, 2008

(51) Int. Cl.
*H01J 9/24* (2006.01)
(52) U.S. Cl. .................................... 445/24
(58) Field of Classification Search ............. 313/504; 445/24
See application file for complete search history.

(56) References Cited

U.S. PATENT DOCUMENTS

| | | | |
|---|---|---|---|
| 4,833,043 A * | 5/1989 | Gardner | 428/822.5 |
| 5,821,692 A * | 10/1998 | Rogers et al. | 313/512 |
| 6,551,948 B2 * | 4/2003 | Ohmi et al. | 438/778 |
| 6,924,594 B2 | 8/2005 | Ogura et al. | 313/506 |
| 6,954,041 B2 | 10/2005 | Korenaga | |
| 7,288,420 B1 | 10/2007 | Yamazaki et al. | 438/29 |

(Continued)

FOREIGN PATENT DOCUMENTS

CN        1290042        4/2001

(Continued)

OTHER PUBLICATIONS

Deyan, H., et al. "Low-Temperature Deposition of Textured Polycrystalline Silicon Films by Layer-by-Layer Technique," Chinese Journal of Semiconductors, vol. 19, No. 9, Sep. 1998 (pp. 661-666).

(Continued)

*Primary Examiner*—Joseph L Williams
*Assistant Examiner*—Hana S Featherly
(74) *Attorney, Agent, or Firm*—Fitzpatrick, Cella, Harper & Scinto

(57) ABSTRACT

An organic EL light emitting element is provided with a conductive transparent electrode 3, a counter electrode 8 opposing the conductive transparent electrode 3, an organic EL light emitting layer 6 provided between the conductive transparent electrode 3 and the counter electrode 8, an insulating protection layer 9 provided to cover at least the organic EL light emitting layer 6, and a heat dissipating layer 11 which is brought into contact with the insulating protection layer 9. The conductive transparent electrode has an ITO film including at least one of Hf, V and Zr at least on the surface part on the side of the organic EL light emitting layer 6, and the insulating protection layer 9 includes a nitride film having a thickness of 100 nm or less.

3 Claims, 15 Drawing Sheets

U.S. PATENT DOCUMENTS

| | | |
|---|---|---|
| 7,291,973 B2 | 11/2007 | Ishihara et al. ............... 313/505 |
| 7,301,277 B2 | 11/2007 | Hayashi |
| 7,309,531 B2 | 12/2007 | Suzuki et al. ............... 428/690 |
| 7,786,958 B1 | 8/2010 | Koyama ...................... 345/76 |
| 2003/0048072 A1 | 3/2003 | Ishihara et al. ............... 313/506 |
| 2003/0085654 A1 | 5/2003 | Hayashi |
| 2003/0117071 A1* | 6/2003 | Lee et al. .................... 313/512 |
| 2004/0066137 A1 | 4/2004 | Hayashi |
| 2004/0221809 A1 | 11/2004 | Ohmi et al. |

FOREIGN PATENT DOCUMENTS

| | | |
|---|---|---|
| CN | 1290042 A | 4/2001 |
| CN | 1416006 | 5/2003 |
| CN | 1416008 | 5/2003 |
| EP | 1 087 444 A2 | 9/2000 |
| EP | 1 087 444 A2 | 3/2001 |
| EP | 1 115 147 | 7/2001 |
| JP | 05334924 A * | 12/1993 |
| JP | 07-262829 | 10/1995 |
| JP | 10-275680 | 10/1998 |
| JP | 11-121180 | 4/1999 |
| JP | 2000-58256 | 2/2000 |
| JP | 2001-052864 | 2/2001 |
| JP | 2001-092413 A | 4/2001 |
| JP | 2001-140066 | 5/2001 |
| JP | 2001-326071 | 11/2001 |
| JP | 2002-184569 | 6/2002 |
| JP | 2002-280171 | 9/2002 |
| JP | 2002-343559 A | 11/2002 |
| JP | 2003-59644 | 2/2003 |
| JP | 2003-068472 | 3/2003 |
| JP | 2003-142255 A | 5/2003 |
| JP | 2004-030934 A | 1/2004 |
| JP | 2004-095199 A | 3/2004 |
| JP | 2004-127551 A | 4/2004 |
| WO | WO 00/74127 A1 | 12/2000 |
| WO | WO 03/045115 | 5/2003 |

OTHER PUBLICATIONS

Chinese Office Action (including English translation) issued in the corresponding counterpart application No. 2009-10203880.1 (16 pages).

* cited by examiner

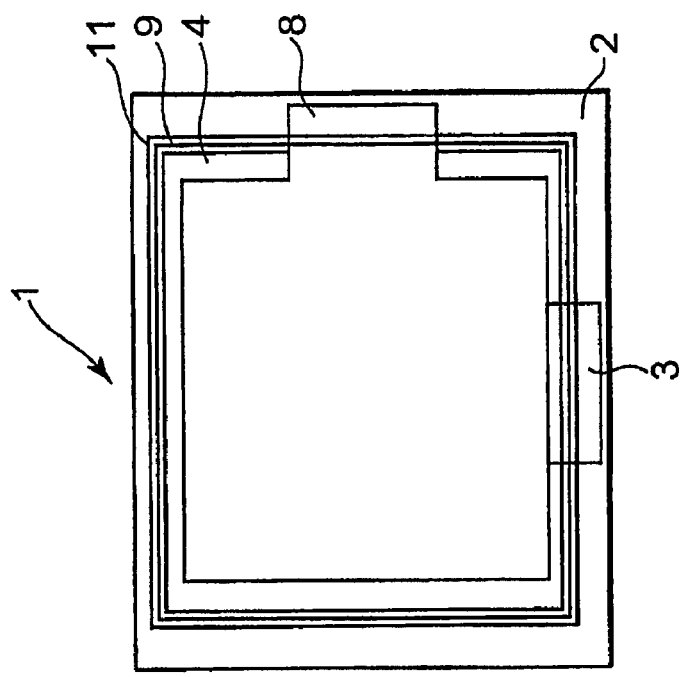
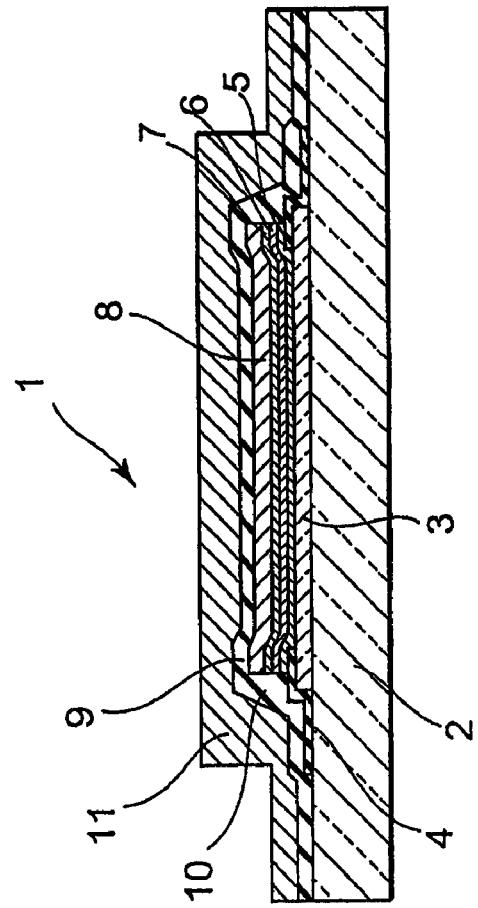
FIG. 1A
FIG. 1B

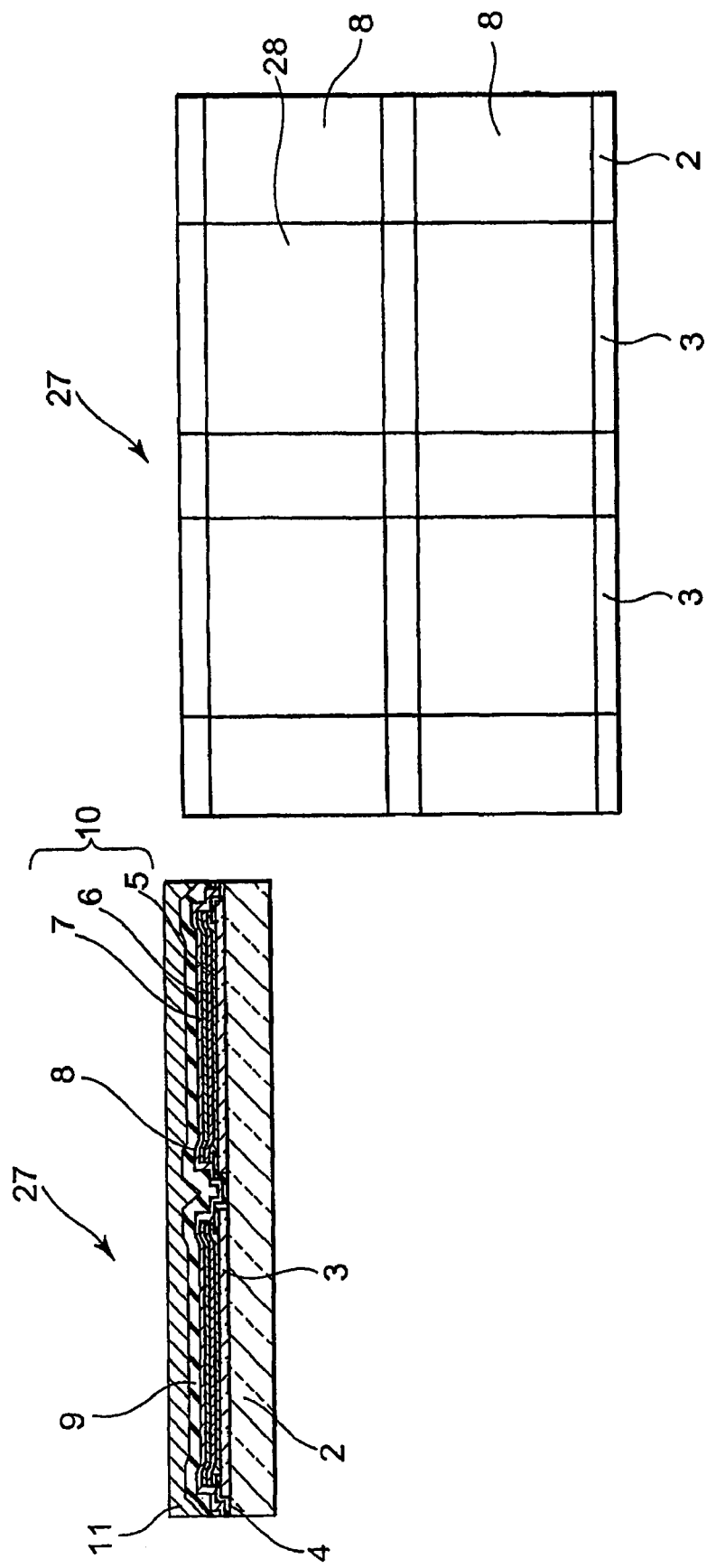

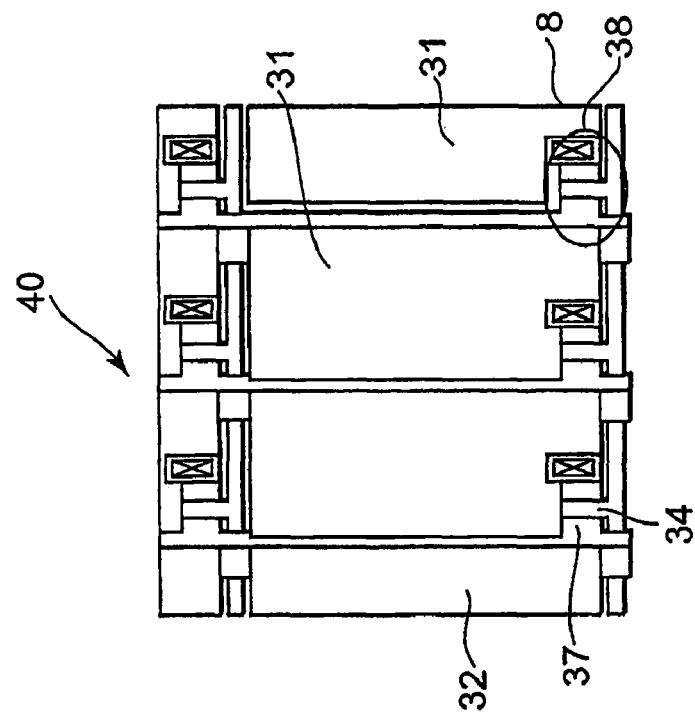
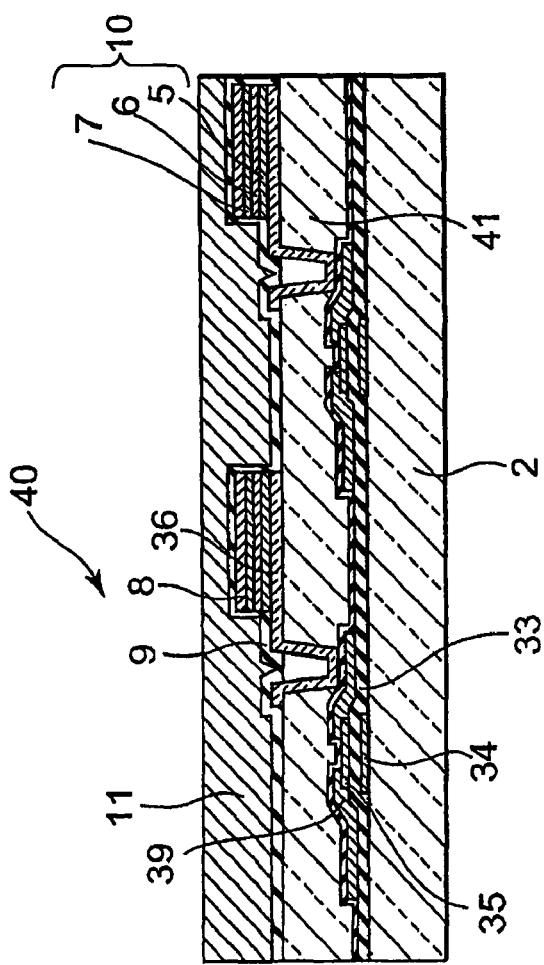

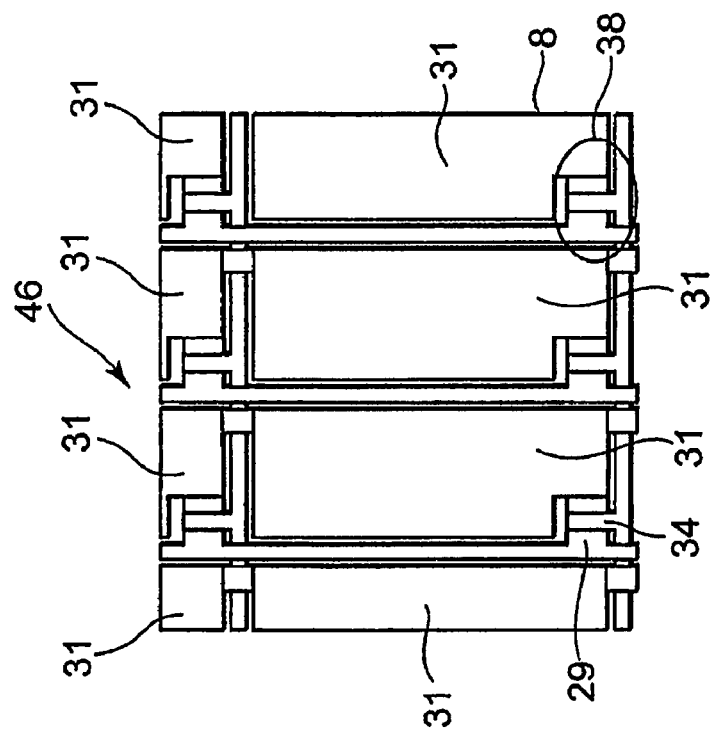
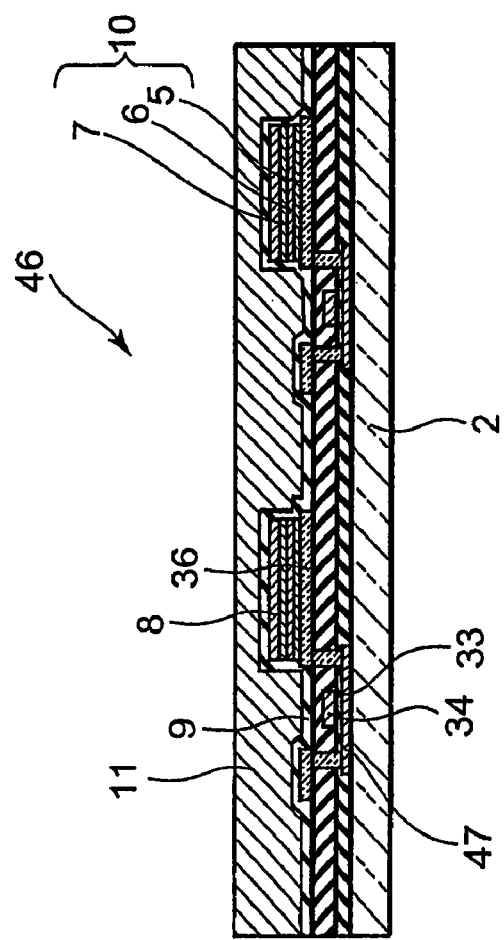
FIG. 10B
FIG. 10A

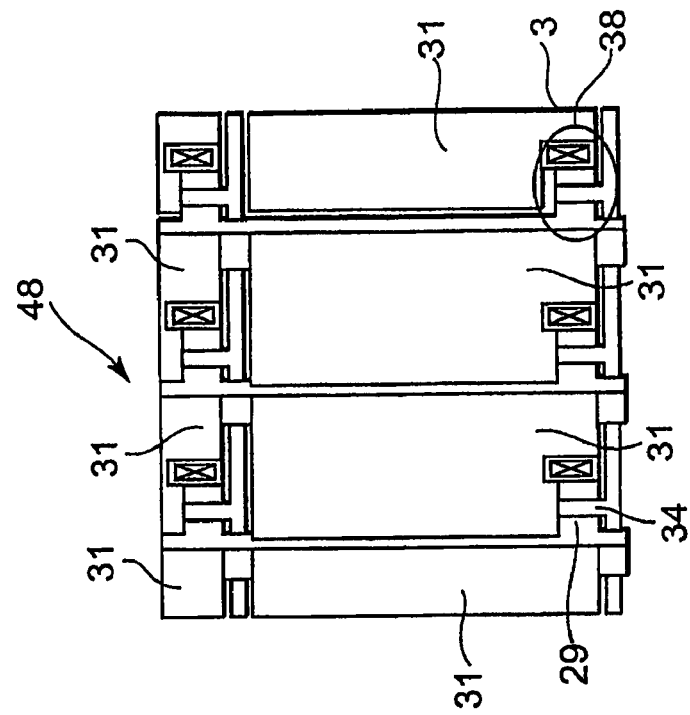
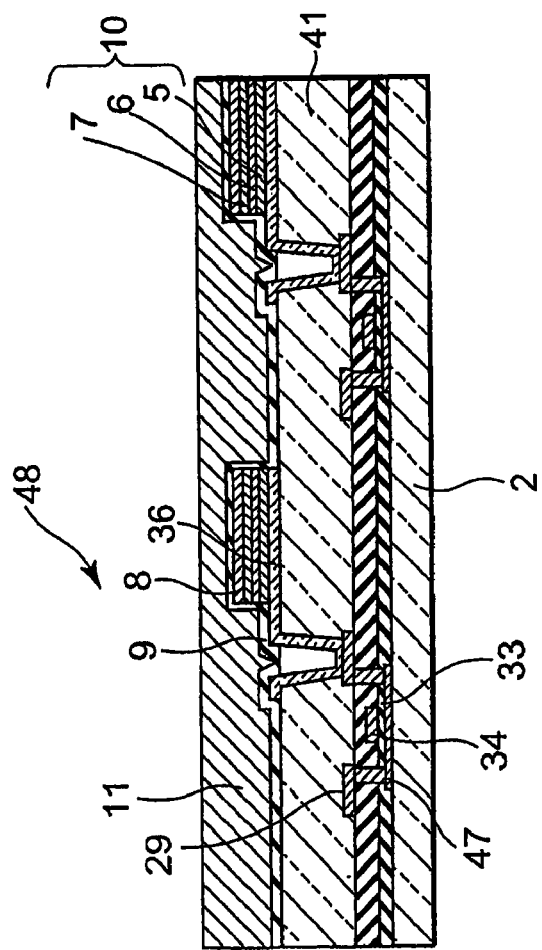
FIG. 11A
FIG. 11B

ORGANIC EL LIGHT EMITTING ELEMENT, MANUFACTURING METHOD THEREOF, AND DISPLAY DEVICE

TECHNICAL FIELD

This invention relates to a light emitting element, such as a display element, particularly an organic electro-luminescence (EL) display element and, in particular, relates to an improvement in a protective layer of such a light emitting element.

BACKGROUND ART

In recent years, self-luminous organic electro-luminescence (EL) display devices have been actively studied as display devices that can achieve high brightness while being of the thin type. An organic EL element has a structure in which an organic layer serving as a light emitting layer is sandwiched between opposing electrodes, and the light emission is controlled by on/off of the current to the electrodes, thereby forming a display device. The display devices are classified into a passive matrix type and an active matrix type. The former is used as a backlight or a relatively low definition display device and the latter is used as a relatively high definition display device such as a television or a monitor.

In organic EL elements forming such organic EL display devices, a large problem is that an organic layer has a short lifetime which serves as a light emitting layer. Although the light emission time has been increasing through various studies in recent years, the current element lifetime is still short when used, for example, for a television or a monitor, and the brightness is reduced by half in 2000 to 3000 hours in the case of continuous lighting. As a reason for the short element lifetime, invasion of moisture into the organic layer serving as the light emitting layer or thermal destruction due to heating after formation of the organic layer or due to heat generation of the element is notable, and various improvements have been improved.

Organic EL light emitting elements of this type are described in Japanese Unexamined Patent Application Publication (JP-A) No. H10-275680 and Japanese Unexamined Patent Application Publication (JP-A) No. 2002-343559 (hereinafter referred to as Patent Document 1 and Patent Document 2). Among them, Patent Document 1 discloses the organic EL light emitting elements having a protective film in the form of a multilayer structure including two layers, i.e. an organic layer and a metal layer, or two layers, i.e. an inorganic layer and a metal layer.

On the other hand, Patent Document 2 discloses an organic EL light emitting layer in which a heat dissipating plate of metal is provided as a heat dissipating member on one of electrodes forming an organic EL element, through an adhesive layer.

In Patent Document 1, when the two layers including the organic layer and the metal layer are employed as the protective film, a problem arises that the thermal conductivity of the organic layer is low and thus the heat generated in the element cannot be sufficiently dissipated or radiated. On the other hand, in the case of the two layers including the inorganic layer and the metal layer, when use is made of $SiO_2$ cited in the Document as an example of a semiconductor compound forming the inorganic protective film, a problem is that the thermal conductivity of $SiO_2$ is low and thus the heat generated in the element cannot be sufficiently dissipated or radiated and, further, it is not possible to sufficiently prevent invasion of moisture as the protective film.

According to Patent Document 2, the problem of heat dissipation can be avoided, but a problem has arisen that a space is formed at a separation portion between light emitting elements in the form of a passive matrix structure and an organic solvent or moisture generated from an adhesive remains at this portion or the adhesive enters this portion, and thus the light emitting layer protection, which is most important, cannot be securely achieved, thereby reducing the element lifetime.

Further, a problem has arisen that since a method of forming the foregoing protective film is generally performed at a temperature that does not decompose an organic layer, it is not possible to form a fine thin film and, therefore, it is necessary to form a protective film having a thickness of several hundred nanometers to several microns in order to prevent permeation of moisture or organic compounds, resulting in an increase in thermal resistance to raise the temperature of an element to thereby shorten the lifetime thereof. As described above, although it is essential to prevent the incorporation of moisture or organic compounds into a light emitting layer and electronic layers and efficiently remove the heat generated in an element for increasing the lifetime of an organic EL element and an organic EL display device, effective means have not yet been proposed.

DISCLOSURE OF THE INVENTION

This invention has been made in consideration of the foregoing problems and provides a long-lifetime organic EL element and a long-lifetime organic EL display device, and a method and apparatus for manufacturing them, which, specifically, will be described hereinbelow.

That is, according to one aspect of the present invention, there is provided an organic EL light emitting element, which includes a conductive transparent electrode, a counter electrode opposed to the conductive transparent electrode, an organic EL light emitting layer provided between the conductive transparent electrode and the counter electrode, an insulating protective layer provided to cover at least the organic EL light emitting layer, and a heat dissipating layer provided to be in contact with the insulating protective layer. In the aspect of the present invention, at least a surface portion of the conductive transparent electrode on the side of the organic EL light emitting layer includes an ITO film containing at least one of Hf, V and Zr. The insulating protective layer includes a nitride film having a thickness of 100 nm or less.

In the aspect of the present invention, it is preferred that the nitride film is composed of at least one of compounds of nitrogen and an element selected from the group consisting of Ti, Zr, Hf, V, Nb, Ta, Cr, B, Al and Si, and more preferred that the nitride film is composed of at least one of silicon nitride, titanium nitride, tantalum nitride and aluminum nitride.

Since a nitride film is finer than an oxide film, it is excellent in moisture prevention effect and heat dissipation effect as compared with the oxide film.

Since the heat dissipation efficiency increases as the thickness decreases, it is necessary to minimize the thickness as long as the function as a protective film is ensured and, from this aspect, it is set to 100 nm or less, preferably 30 nm to 50 nm. The insulating protective layer may comprise an insulating layer covering the organic EL light emitting layer through the counter electrode and a protective layer covering the insulating layer. This structure is necessary particularly when the protective layer is conductive.

This invention is also applicable to general display elements other than the organic EL element, The present invention can be applied to a general display element other than the organic EL light emitting element.

According to another aspect of the present invention, there is provided a display element which includes a conductive transparent electrode, a counter electrode opposed to the conductive transparent electrode, a light emitting layer provided between the conductive transparent electrode and the counter electrode, a protective layer covering at least the light emitting layer, and a heat dissipating layer contacting the protective layer. In the display element, it is preferred that at least a surface portion of the conductive transparent electrode includes an ITO film containing at least one of Hf, V and Zr.

In the other aspect of the present invention, the protective layer may contain at least an element selected from the group consisting of Ar, Kr, and Xe.

According still another aspect of the present invention, there is provided a method of manufacturing a light emitting element. The light emitting element includes a conductive transparent electrode, a counter electrode opposed to the conductive transparent electrode, a light emitting layer provided between the conductive transparent electrode and the counter electrode, and a protective layer provided to cover at least the light emitting layer. In the aspect of the present invention, the method includes the step of forming the protective layer using a plasma containing, as a main component, a gas selected from the group consisting of Ar, Kr and Xe.

In the aspect of the present invention, it is preferred that the plasma is a plasma excited by a high frequency. Prticularly, the high frequency is a microwave.

In the aspect of the present invention, it is also preferred that the protective layer is formed by low-temperature vapor deposition that is performed at 100° C. or less and, preferably, at room temperature. It is more preferred that The low-temperature vapor deposition is performed without heating excepting in a case of the plazuma heating.

According to yet another aspect of the present invention there is provided an organic EL display device.

The organic EL display device includes a plurality of gate lines and a plurality of signal lines arranged in a matrix, switching elements provided at intersections of the gate lines and the signal lines, conductive transparent electrodes, counter electrodes opposed to the conductive transparent electrodes, organic EL light emitting layers provided between the conductive transparent electrodes and the counter electrodes, respectively, a protective layer provided to cover at least the organic EL light emitting layers, and a heat dissipating layer provided to be in contact with the protective layer. In the organic EL display device, the switching elements are TFTs, each of the TFTs having a gate electrode connected to the gate line, a signal line electrode connected to the signal line, and a pixel electrode connected to the conductive transparent electrode or the counter electrode through a contact hole formed in an insulating film covering the TFTs, at least a surface portion of each of the conductive transparent electrodes on the side of the organic EL light emitting layer including an ITO film containing at least one of Hf, V and Zr.

On the other hand, another organic EL display device includes a plurality of gate lines and a plurality of signal lines arranged in a matrix on a substrate, switching elements provided at intersections of the gate lines and the signal lines, conductive transparent electrodes, counter electrodes opposed to the conductive transparent electrodes, organic EL light emitting layers provided between the conductive transparent electrodes and the counter electrodes, respectively, a protective layer provided to cover at least the organic EL light emitting layers, and a heat dissipating layer provided to be in contact with the protective layer. In the other organic EL display device, the switching elements are TFTs each of which having a gate electrode connected to the gate line, a signal line electrode connected to the signal line, and a pixel electrode connected to the conductive transparent electrode or the counter electrode, the gate lines and the gate electrodes being embedded in the substrate or in an insulating film formed to be in contact with the substrate.

In the aspect of the present invention, it is preferred that at least a surface portion of each of the conductive transparent electrodes on the side of the organic EL light emitting layer includes an ITO film containing at least one of Hf, V and Zr and the protective layer includes a nitride film having a thickness of 100 nm or less.

According to a further aspect of the present, there is provided a method of manufacturing a conductive transparent film which includes the step of performing sputtering film formation using a plasma containing Kr or Xe as a main component.

According to a still further aspect of the present invention, there is provided a method of manufacturing a conductive transparent film which includes the steps of forming an ITO film by sputtering of a target containing indium oxide and tin oxide using a plasma excited by a high frequency, and performing the sputtering using the plasma containing at least one of Kr and Xe as a main component.

According to a still further aspect of the present invention, there is provided a method of forming a nitride film which includes the step of performing vapor deposition of a nitride film using a microwave-excited plasma, wherein the step of the vapor deposition is performed using the plasma containing at least one of Ar, Kr and Xe as a main component and at a low temperature without heating except heating by the plasma.

In the method, it is preferred that the microwave-excited plasma vapor deposition is performed by the steps of using a plasma processing apparatus having dual shower plates, introducing a gas containing at least one of Ar, Kr and Xe into the apparatus from the upper shower plate to generate the plasma, and introducing a material gas of the nitride film into the plasma from the lower shower plate.

It is also preferred that at the time of the vapor deposition of the nitride film, a high frequency is applied to a film-forming member to thereby generate a bias potential on a surface of the film-forming member.

BRIEF DESCRIPTION OF THE DRAWINGS

FIG. 1A is a sectional view showing the structure of a bottom emission type passive display element of Embodiment 1 of this invention;

FIG. 1B is a plan view showing the structure of the bottom emission type passive display element of FIG. 1A;

FIG. 4A is a sectional view showing part of pixels of a bottom emission type passive matrix organic EL display device of Embodiment 3 of this invention;

FIG. 4B is a plan view showing part of the pixels of the bottom emission type passive matrix organic EL display device of FIG. 4A;

FIG. 7A is a sectional view showing part of organic EL elements according to Embodiment 6 of this invention;

FIG. 7B is a plan view showing part of the organic EL elements of FIG. 7A;

FIG. 10A is a sectional view showing part of an organic EL display device according to Embodiment 9 of this invention;

FIG. 10B is a plan view showing part of the organic EL display device of FIG. 10A;

FIG. 11A is a sectional view showing part of an organic EL display device according to Embodiment 10 of this invention;

FIG. 11B is a plan view showing part of the organic EL display device of FIG. 11A;

BEST MODE FOR CARRYING OUT THE INVENTION

Figure 2:
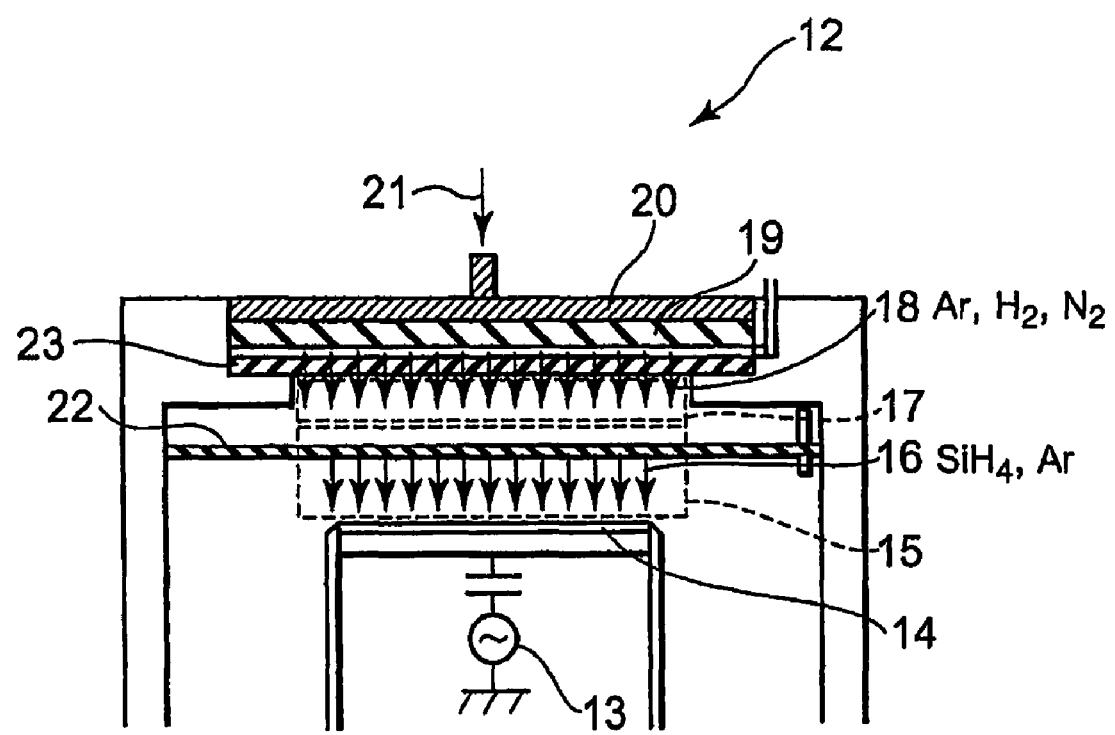
FIG. 2 is a diagram showing a schematic structure of a dual shower plate microwave-excited high-density plasma film forming apparatus used in the Embodiment.

Hereinbelow, Embodiments of this invention will be described with reference to the drawings.

Embodiment 1

Referring to FIGS. 1A and 1B, a bottom emission type passive display element 1 according to Embodiment 1 includes a transparent substrate 2, a conductive transparent electrode 3 formed on the transparent substrate 2, a hole transport layer 5, a light emitting layer 6, and an electron transport layer 7 which form an organic layer 10 stacked on the conductive transparent electrode 3, a counter electrode 8 stacked on the organic layer 10, a protective layer 9 formed to cover them, and a heat dissipating layer 11 formed to be in contact with the protective layer 9.

As the transparent substrate 2, use can be made of a material adapted to transmit light radiated from the light emitting layer 6 and a glass substrate was used in Embodiment 1.

An indium-tin oxide (ITO) film doped with Hf which may be replaced by V or Zr, was used as the conductive transparent electrode 3 for increasing a work function of its surface contacting the organic layer 10 to improve the efficiency of hole injection into the element. This makes unnecessary a hole injection layer or a buffer layer that is generally required.

The organic layer 10 is composed of the hole transport layer 5, the light emitting layer 6, and the electron transport layer 7 and is not particularly limited and, even if any of known materials are used, the operation/effect of this invention is obtained. The hole transport layer 5 serves to efficiently move holes to the light emitting layer 6 and to suppress movement of electrons from the counter electrode 8 to the side of the conductive transparent electrode 3 through the light emitting layer 6, thereby enhancing the efficiency of recombination of electrons and holes in the light emitting layer 6.

Although not particularly limited, use can be made, as a material constituting the hole transport layer 5, of, for example, 1,1-bis(4-di-p-aminophenyl)cyclohexane, carbazole or its derivative, triphenylamine or its derivative, or the like.

Although not particularly limited, use can be made, as the light emitting layer 6, of quinolinol aluminum complex containing a dopant, DPVi biphenyl, or the like. Depending on use, red, green, and blue phosphors may be used by stacking them and, in a display device or the like, red, green, and blue phosphors may be used by arranging them in a matrix.

A silole derivative, a cyclopentadiene derivative, or the like can be used as the electron transport layer 7.

No particular limitation can be made of a material forming the counter electrode 8 and use can be made of aluminum having a work function of 3.7 eV, or the like.

A nitride of an element selected from the group consisting of Ti, Zr, Hf, V, Nb, Ta, Cr, B, Al, and Si is preferable as the protective layer 9 serving to prevent invasion of moisture, an oxidizing gas, or the like into the organic EL light emitting layer. Although a thinner thickness is preferable in terms of reducing the thermal resistance, about 10 nm to 100 nm is preferable for preventing permeation of moisture, an oxidizing gas, or the like and 30 nm to 50 nm is more preferable.

In the case where the protective layer 9 is composed of the foregoing nitride, since the thermal conductivity is high and the thermal resistance can be reduced, the protective layer 9 can also serve as the heat dissipating layer 11. However, the heat dissipating layer 11 may also be provided for carrying out the heat dissipation more efficiently.

Aluminum, copper, or the like having a high thermal conductivity is preferable as the heat dissipating layer 11.

Next, description will be made as regards a method of manufacturing the display element according to this embodiment. An ITO containing 5 wt % Hf was formed into a film on the cleaned glass substrate by a sputtering method. The film formation employed a co-sputtering method using an ITO target (preferably a sintered body of indium oxide and tin oxide) and a Hf target. In the sputtering, Xe having a large collision sectional area was used as a plasma excitation gas, thereby generating a plasma having a sufficiently low electron temperature. The substrate temperature was set to 100° C. and the film thickness was set to 200 angstroms. A Hf-doped portion was limited to a surface layer and only the undoped ITO was used thereafter. Since the sputtering was carried out using the Xe plasma, the electron temperature was sufficiently low and, thus, even if the film formation was performed while irradiating Xe ions onto the ITO surface during the film formation for improving the film quality, plasma damage to the ITO film was suppressed and therefore the high-quality film formation was achieved even at a low temperature of 100° C. or less. The Hf-containing ITO film thus formed was patterned into a predetermined shape. The patterning was performed by a photolithography method. A novolak-based resist was used as a photoresist and, after carrying out exposure using a mask aligner and development using a predetermined developer, surface organic compound removal cleaning by ultraviolet irradiation was performed for 10 minutes. Then, using an organic film vapor deposition apparatus, the hole transport layer 5, the light emitting layer 6, and the electron transport layer 7 were continuously formed. Then, without exposing the substrate to the atmosphere, aluminum was deposited to form the counter electrode 8 using an aluminum vapor deposition apparatus adjacent to the organic film vapor deposition apparatus. Then, without exposing the substrate to the atmosphere, it was conveyed to an insulating protective film forming apparatus, where a silicon nitride film was deposited to form the insulating protective film 9. In the silicon nitride film formation, a plasma CVD method using a microwave-excited plasma was employed, wherein use was made of a gas with a volume ratio of $Ar:N_2:H_2:SiH_4=80:18:1.5:0.5$. The process pressure is preferably 0.1 to 1 Torr and, in this Embodiment, it was set to 0.5 Torr. A high frequency of 13.56 MHz was applied from the back of the substrate to thereby generate a potential of about −5V as a bias potential on the substrate surface, and ions in the plasma were irradiated onto it. The substrate temperature was set to room temperature during the silicon nitride film formation and heating by heating means was not performed other than unavoidable heating by the plasma. The film thickness was set to 50 nm.

Referring to FIG. 2, a dual shower plate microwave-excited high-density plasma film forming apparatus 12 used in the film formation has a chamber in which an ion irradiation bias high-frequency power source 13 is disposed and a processing object substrate 14 is placed thereover. A lower shower plate 22, an upper shower plate 23, and thereover, a dielectric window 19 and a microwave radiating antenna 20 are disposed so as to be opposed to the substrate in the order named. When a microwave is introduced as indicated by an arrow 21, gases such as Ar, $H_2$, and $N_2$ from the upper shower plate 23 become a plasma-excited gas 18 in a plasma excitation region 17, while, material gases such as $SiH_4$ and Ar are supplied from the lower shower plate 22 and reach the substrate through a process region (plasma diffusion region) 15. This dual shower plate microwave-excited high-density plasma film forming apparatus 12 uses the microwave-excited plasma and can arrange the process region at a position away from the plasma excitation region. Therefore, the electron temperature in the process region is 1.0 eV or less even when Ar is used, and the plasma density is $10^{11}/cm^2$ or more. Because of the dual shower plate structure having the upper shower plate 23 and the lower shower plate 22, the material gases such as the silane can be introduced into the process region away from the plasma excitation region and, therefore, excessive dissociation of the silane can be prevented and, even at room temperature, the light emitting element and the formed protective film were free from a defect and it was possible to form the fine film. By applying the high frequency from the back of the substrate to generate the bias potential on the substrate surface and irradiating ions onto the substrate surface from the microwave-excited plasma, it was possible to finely form the nitride film, thereby further improving the film quality. Although the substrate is heated by the plasma as described above, it is also important not to perform heating other than that. The vapor deposition may be carried out while cooling the substrate for suppressing the heating by the plasma.

Thereafter, aluminum was further formed into a film with a thickness of 1 micron using the aluminum vapor deposition apparatus, thereby obtaining the heat dissipating layer.

Instead of the aluminum vapor deposition, aluminum sputtering film formation may be carried out. In this event, the sputtering film formation using a Xe plasma with a low electron temperature is effective.

Through the foregoing processes, the light emitting element of this Embodiment 1 was obtained. As a result of measuring the element lifetime of the light emitting element of this Embodiment, the luminance half-decay lifetime being conventionally 2000 hours increased to 6000 hours and thus the effect of the protective layer 9 was confirmed.

Embodiment 2

Figure 3B:
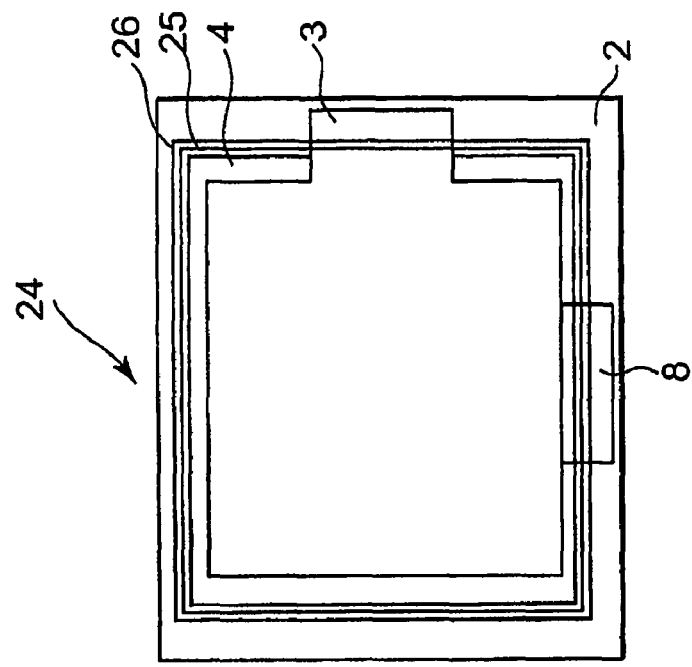
FIG. 3B is a plan view showing the structure of the top emission type passive display element of FIG. 3A.
Figure 3A:
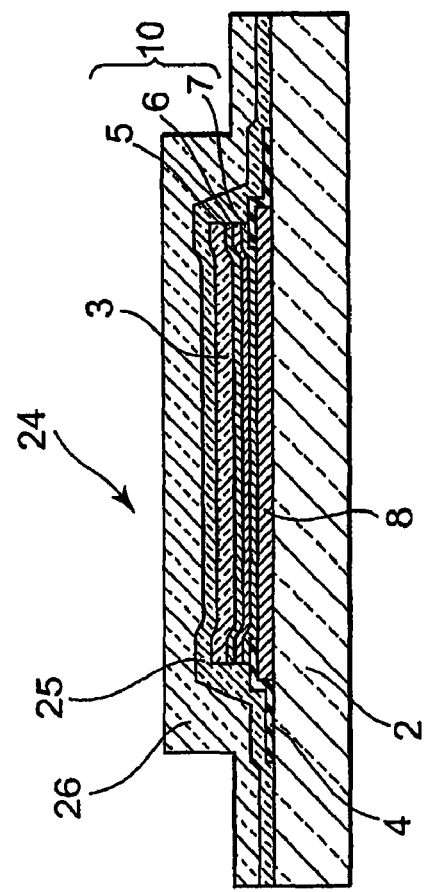
FIG. 3A is a sectional view showing the structure of a top emission type passive display element of Embodiment 2 of this invention.

Referring to FIGS. 3A and 3B, a top emission type passive display element 24 according to Embodiment 2 includes a substrate 2, a counter electrode 8 formed on the substrate 2 so as to be opposed to a conductive transparent electrode 3, an electron transport layer 7, a light emitting layer 6, and a hole transport layer 5 which form an organic layer 10 stacked on the counter electrode 8, the conductive transparent electrode 3 stacked on the organic layer 10, a transparent protective layer 25 formed to cover them, and a transparent heat dissipating layer 26 formed to be in contact with the transparent protective layer 25. Because of being the top emission type, although a material of the substrate is not particularly limited, a metal, silicon nitride, aluminum nitride, boron nitride, or the like is preferable in terms of heat dissipation. In the case of using the metal substrate, the substrate 2 may also serve as the counter electrode 8.

The electron transport layer 7, the light emitting layer 6, and the hole transport layer 5 were stacked by the same method as that described in Embodiment 1. Although known materials can be used as materials of the respective layers, the materials shown in Embodiment 1 are cited as examples.

Depending on use, red, green, and blue phosphors may be used in a single layer or stacked layers as the light emitting layer 6.

Then, by the method shown in Embodiment 1, an ITO film containing 5 wt % Hf was formed to thereby obtain the counter electrode 8. Since the ITO film was formed by sputtering using a Xe plasma with a low electron temperature, damage to the underlying organic layer 10 or the formed ITO film due to the plasma was not observed and it was possible to carry out high-quality film formation at a low temperature. Silicon nitride was formed into a film by the method shown in Embodiment 1 so as to cover the top emission type organic EL element thus obtained, thereby obtaining the insulating transparent protective film 25 also serving as the heat dissipating layer 26. The thickness of this insulating protective film 25 was set to 50 nm. Since silicon nitride has a high thermal conductivity of 80 W/(m·K) and, further, it was possible to form the fine thin film by the microwave-excited plasma, the thermal resistance can be sufficiently reduced to thereby suppress temperature rise of the element and, therefore, the protective layer 25 sufficiently functions also as the heat dissipating layer 26. If a metal is used as the substrate 2 and silicon nitride is used as the insulating protective layer 25, sufficient heat dissipation is achieved, while, the heat dissipating layer 26 may also be used separately for efficiently carrying out the heat dissipation. No particular limitation is made of a material of the transparent heat dissipating layer 26 used in the top emission type as long as it has a high thermal conductivity and is transparent, and an ITO or the like is cited as an example. The luminance half-decay lifetime of the organic EL element thus completed was measured to be 9000 hours while being conventionally 3000 hours and, therefore, the effect of the protective layer 25 was confirmed.

Embodiment 3

Referring to FIGS. 4A and 4B, a bottom emission type passive matrix organic EL display device 27 according to Embodiment 3 includes a transparent substrate 2, conductive transparent electrodes 3, a hole transport layer 5, a light emitting layer 6, and an electron transport layer 7 which form each of organic layers 10 stacked on the conductive transparent electrodes 3, respectively, counter electrodes 8 formed on the organic layers 10, respectively, a protective layer 9 formed to directly or indirectly cover the light emitting layers 6, and a heat dissipating layer 11. Since it is configured such that the bottom emission type organic EL display elements shown in Embodiment 1 are arranged in a matrix, those elements respectively selected by the conductive transparent electrodes 3 and the counter electrodes 8 are adapted to emit light. The conductive transparent electrodes 3 and the counter electrodes 8 are patterned into a matrix, thereby arranging the elements. Symbol 28 denotes a light emitting portion.

As a protective film forming the protective layer 9, silicon nitride, aluminum nitride, boron nitride, or the like is preferable in terms of insulation between the different counter electrodes and, in Embodiment 3, use was made of silicon nitride formed by the method described in Embodiment 1. Since the elements shown in Embodiment 1 are arranged in a matrix, although the display device is simply configured, the similar effect to Embodiment 1 is obtained and thus the luminance half-decay lifetime of the elements is improved by the fine and thin protective layer 9. As a result of measurement, the luminance half-decay lifetime being conventionally 2000 hours increased to 6000 hours.

Embodiment 4

Figure 5B:
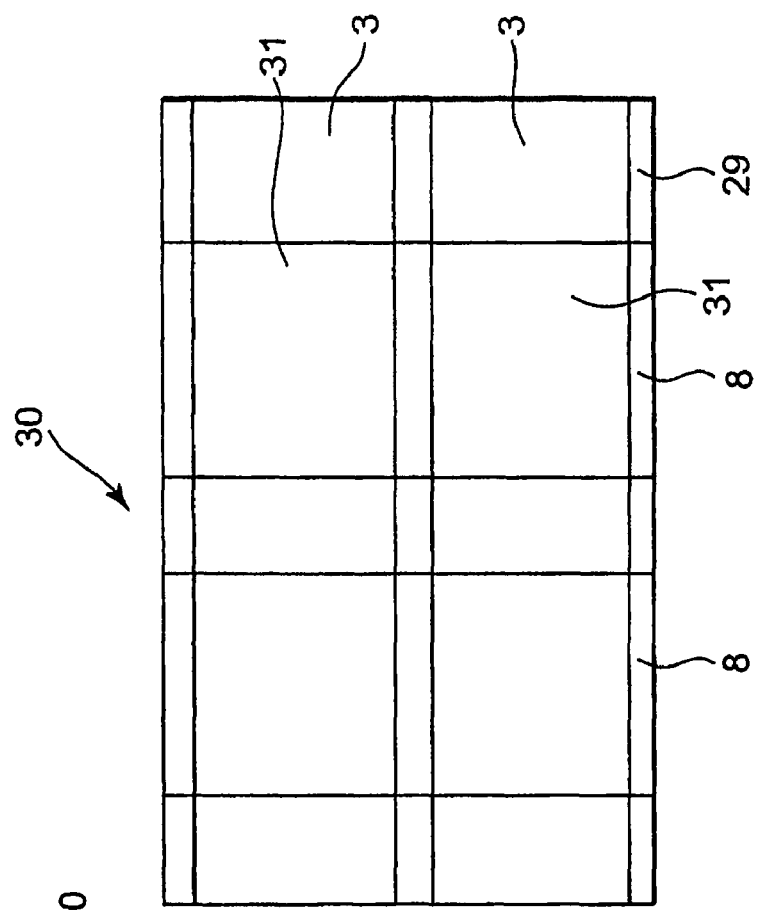
FIG. 5B is a plan view showing part of the pixels of the top emission type passive matrix organic EL display device of FIG. 5A.
Figure 5A:
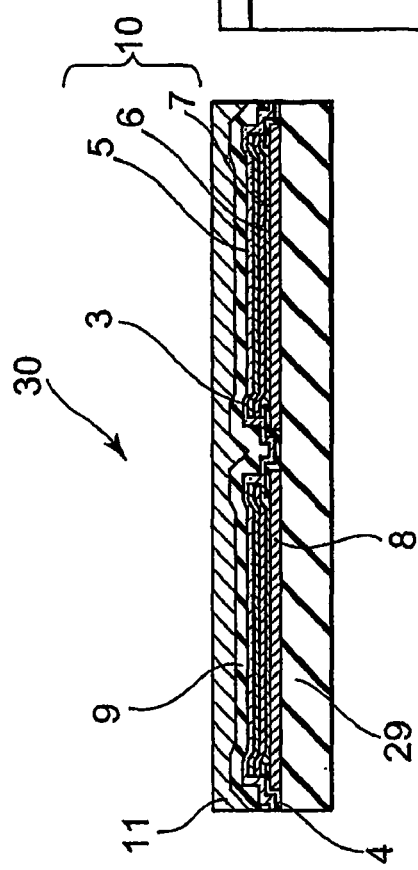
FIG. 5A is a sectional view showing part of pixels of a top emission type passive matrix organic EL display device of Embodiment 4 of this invention.

Referring to FIGS. 5A and 5B, a top emission type passive matrix organic EL display device 30 according to Embodiment 4 includes a transparent substrate 29, counter electrodes 8 opposed to conductive transparent electrodes 3, an electron transport layer 7, a light emitting layer 6, and a hole transport layer 5 which form each of organic layers 10 stacked on the counter electrodes 8, respectively, the conductive transparent electrodes 3 formed on the organic layers 10, respectively, a protective layer 9 formed to directly or indirectly cover the light emitting layers 6, and a heat dissipating layer 11. Since it is configured such that the top emission type organic EL display elements shown in Embodiment 2 are arranged in a matrix, those elements respectively selected by the conductive transparent electrodes 3 and the counter electrodes 8 are adapted to emit light. Since the elements caused to emit light are selected by the counter electrodes 8 disposed on the substrate 29 and the conductive transparent electrodes 3, the substrate 29 is insulative and is preferably a glass or quartz substrate, a silicon nitride substrate, an aluminum nitride substrate, a boron nitride substrate, or the like and more preferably, in terms of heat dissipation, the silicon nitride substrate, the aluminum nitride substrate, the boron nitride substrate, or the like having a high thermal conductivity. In Embodiment 4, use was made of silicon nitride formed by the method described in Embodiment 1. Symbol 31 denotes a light emitting portion.

The conductive transparent electrodes 3 and the counter electrodes 8 are patterned into a matrix, thereby arranging the elements. The same effect as in Embodiment 2 is obtained and thus the luminance half-decay lifetime of the elements is improved by the fine and thin protective layer 9. As a result of measurement, the luminance half-decay lifetime being conventionally 3000 hours increased to 9000 hours.

Embodiment 5

Figure 6A:
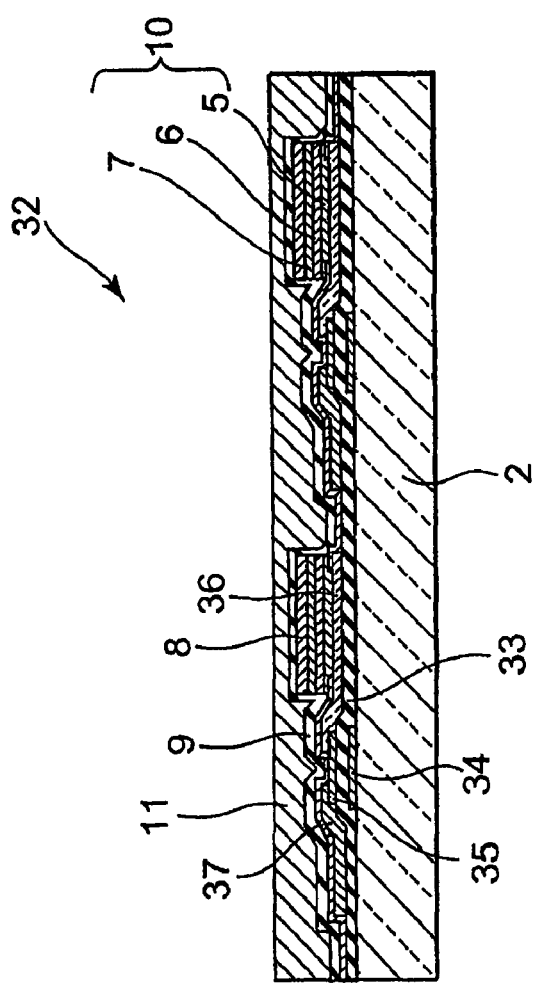
FIG. 6A is a sectional view showing part of pixels of a bottom emission type active matrix organic EL display device of Embodiment 5 of this invention.
Figure 6B:
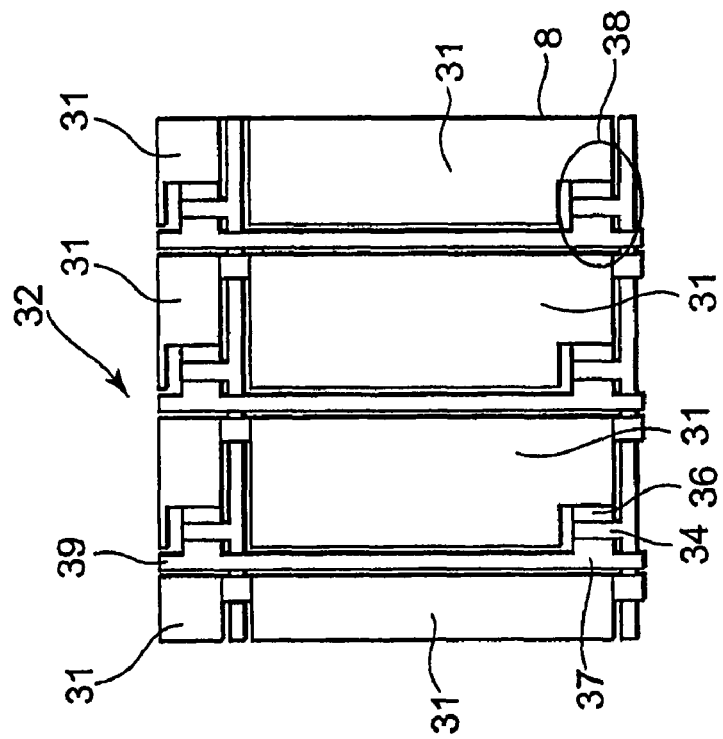
FIG. 6B is a plan view showing part of the pixels of the bottom emission type active matrix organic EL display device of FIG. 6A.

Referring to FIGS. 6A and 6B, a bottom emission type active matrix organic EL display device 32 according to Embodiment 5 includes a transparent substrate 2, a plurality of gate lines, a plurality of signal lines intersecting the gate lines, switching elements disposed at intersections of the gate lines and the signal lines, conductive transparent pixel electrodes 36 connected to the switching elements, a hole transport layer 5, a light emitting layer 6, and an electron transport layer 7 which form each of organic layers 10 stacked on the transparent pixel electrodes 36, respectively, counter electrodes 8 formed on the organic films of the organic layers 10 so as to be opposed to the conductive transparent pixel electrodes 36, respectively, a protective layer 9 formed to directly or indirectly cover at least the organic layers 10, and a heat dissipating layer 11 formed to be in contact with the protective layer 9. In the organic layer 10, the hole transport layer 5, the light emitting layer 6, and the electron transport layer 7 are formed from the side near the transparent pixel electrode 36.

The switching element is preferably a thin-film transistor (TFT) element, a metal injection molding (MIM) element, or the like that can control ON/OFF of the current. The TFT element is preferable in terms of controllability of the brightness of the organic EL element.

Although it differs depending on a specification of a display device, a known amorphous TFT or polysilicon TFT can be suitably used as the TFT element.

Next, description will be made as regards a method of manufacturing the active matrix organic EL display device according to Embodiment 5. At first, Al was formed into a 300 nm film by sputtering on a cleaned glass substrate. In the sputtering, an Ar, Kr, or Xe gas can be suitably used. When Xe is used, since the electron collision sectional area is large and the electron temperature is low, damage by a plasma to the formed Al film is suppressed, which is thus more preferable. Then, the formed Al film was patterned into gate lines and gate electrodes by a photolithography method. Then, using the dual shower plate microwave plasma film forming apparatus used in Embodiment 1, silicon nitride was formed into a 300 nm film at a substrate temperature of 200° C. and at $Ar:N_2:H_2:SiH_4=80:18:1.5:0.5$, thereby obtaining a gate insulating film 33. By setting the substrate temperature to 200° C., it was possible to form a high-quality silicon nitride film having a high withstand voltage and a small interface state density and thus capable of being used as the gate insulating film 33. Then, using the same apparatus, amorphous silicon was formed into a 50 nm film at a substrate temperature of 200° C. and at a volume ratio of $Ar:SiH_4=95:5$ and, subsequently, n+ amorphous silicon was formed into a 30 nm film at $Ar:SiH_4:PH_3=94:5:1$. By patterning the stacked amorphous silicon and n+ silicon films by a photolithography method, element regions were formed. Then, using the same method as that shown in Embodiment 1, an ITO containing 5 wt % Hf was formed into a 350 nm film and then was patterned by a photolithography method, thereby obtaining signal lines 36, signal line electrodes 37, and conductive transparent pixel electrodes 36. Then, using the patterned ITO film as a mask, the n+ amorphous silicon layer was etched by a known ion etching method, thereby forming TFT channel separating regions. Using the dual shower plate microwave plasma film forming apparatus used in Embodiment 1, a silicon nitride film was formed at room temperature, and then was subjected to patterning of organic EL element regions by a photolithography method, thereby obtaining a protective film 9 at each of the TFT channel separating portions and an insulating layer adapted to prevent a short between the conductive transparent electrode 36 and a counter electrode 8 of each organic EL element.

Then, using the method described in Embodiment 1, hole transport, light emitting, and electron transport layers 5, 6, and 7 were continuously formed as organic layers 10 and, without exposure to the atmosphere, Al was formed into a film using a Xe plasma with a low electron temperature by the use of an Al sputtering apparatus used for the formation of the gate lines, thereby obtaining the counter electrodes. Then, silicon nitride was formed into a 50 nm film at room temperature by the dual shower plate microwave plasma film forming apparatus used in Embodiment 1, thereby obtaining a protective layer 9. Since the protective layer 9 has a high thermal conductivity of 80 W/(m·K) and is sufficiently thin, the thermal resistance is small and, therefore, it can also fully serve as a heat dissipating layer alone. However, a heat dissipating layer may also be provided separately for carrying out heat dissipation more efficiently. In this Embodiment, Al was formed into a film using a Xe plasma with a low electron temperature by the use of the Al sputtering apparatus used for the formation of the gate lines, thereby obtaining a heat dissipating layer 11.

According to the bottom emission type active matrix organic EL display device thus obtained, since a buffer layer or a hole injection layer becomes unnecessary because of a high work function possessed by the Hf-containing ITO film, highly efficient light emission is enabled. Further, since use is made of the protective layer 9 having a high thermal conductivity and being thin, the protective layer 9 can suppress temperature rise of the elements while fully achieving its function as a protective layer, so that the element lifetime can be significantly improved. As a result of measuring the luminance half-decay lifetime of the display device shown in this Embodiment, it was improved to 6000 hours while being conventionally 2000 hours.

Embodiment 6

Referring to FIGS. 7A and 7B, a transparent flattening film 41 may be formed on TFTs and, thereafter, organic EL elements may be formed. With this configuration, the organic EL elements can be formed on a flat surface and, therefore, the manufacturing yield is improved. Further, since an organic EL layer is formed at a layer different from a signal line layer, conductive transparent pixel electrodes 36 can be arranged so as to extend over the signal wiring and thus it is possible to increase an area of each light emitting element. Further, since signal lines can be formed of a material different from that of the pixel electrodes, it is not necessary to use a conductive transparent material and, therefore, it is possible to reduce a wiring resistance when a display device is increased in size, thereby enabling an increase in display gradation. A bottom emission type active matrix organic EL display device of Embodiment 6 is formed in the following manner. At first, gate lines, TFT elements, and signal lines were formed by the method described in Embodiment 5. The signal lines were obtained by forming Al into a 300 nm film by the sputtering method using a Xe gas as shown in Embodiment 6 and patterning it by a photolithography method. Then, a photosensitive transparent resin was coated by a spin coating method, then was subjected to exposure and development, and then was dried at 150° C. for 30 minutes, thereby obtaining a flattening film. By the foregoing exposure and development processes, the flattening film was formed with connecting holes each for connection between a pixel-side electrode of the TFT and an organic EL element. As the photosensitive transparent resin, there is an acrylic resin, a polyolefin resin, an alicyclic olefin resin, or the like. The alicyclic olefin resin is excellent in transparency with less moisture content and release and thus is preferable and, in this Embodiment, the alicyclic olefin resin was used. Then, using the method described in Embodiment 1, an ITO film containing 5 wt % Hf was formed and then was patterned by a photolithography method, thereby obtaining conductive transparent pixel electrodes 36. Subsequently, hole transport, light emitting, and electron transport layers 5, 6, and 7 were continuously formed by the method shown in Embodiment 1, and then Al was formed into a film by the sputtering method using a Xe plasma, which is likewise shown in Embodiment 1, thereby obtaining counter electrodes. In the light emitting layer, materials adapted to emit light in red, green, and blue, respectively, may be used by optionally stacking them in layers or may be formed into single layers, respectively, and arranged in a matrix. Then, using the method shown in Embodiment 1, a silicon nitride film was deposited to 50 nm, thereby forming a protective film as a protective layer 9. Since the silicon nitride film has a high thermal conductivity and is formed sufficiently thin, it servers as the protective layer 9 that also serves as a heat dissipating layer 11 even in this state. However, for carrying out heat dissipation more efficiently, Al was deposited by the sputtering method using a Xe plasma, which is shown in Embodiment 1, thereby obtaining the heat dissipating layer 11.

As a result of measuring the luminance half-decay lifetime of the display device thus obtained, the lifetime increased to 6000 hours while being conventionally 2000 hours and, further, the light emitting area increased to an element area ratio of 80% while being conventionally 60% and thus the surface brightness increased by 20%. Since the organic layers 10 were formed on the flattening film 41, there was no occurrence of film formation failure or the like and thus the manufacturing yield was improved.

Embodiment 7

Figure 8B:
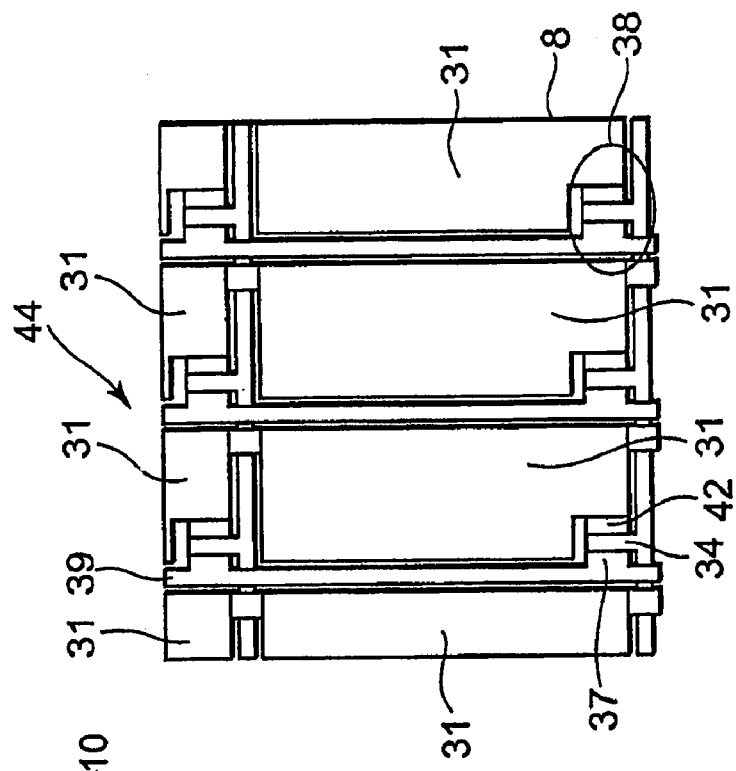
FIG. 8B is a plan view showing part of the pixels of the top emission type active matrix organic EL display device of FIG. 8A.
Figure 8A:
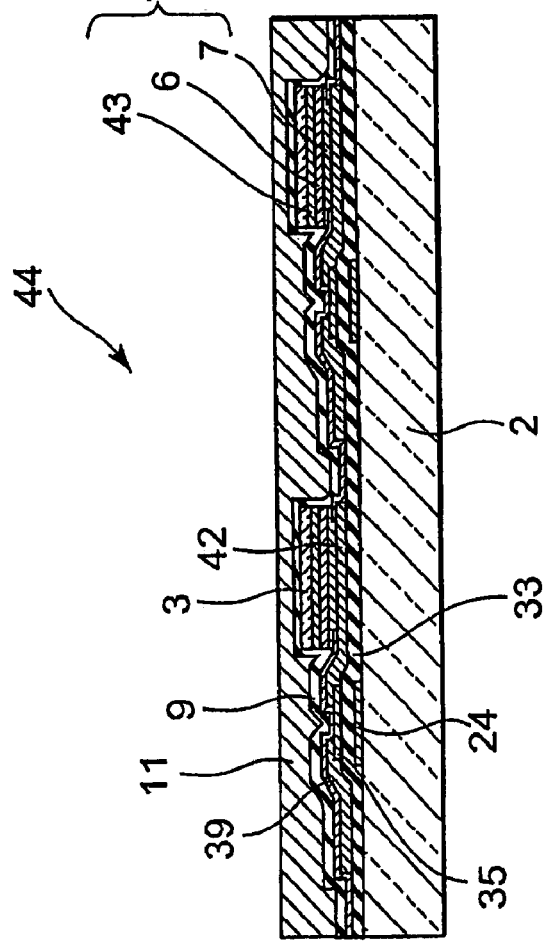
FIG. 8A is a sectional view showing part of pixels of a top emission type active matrix organic EL display device of Embodiment 7 of this invention.

Referring to FIGS. 8A and 8B, a top emission type active matrix organic EL display device 44 according to Embodiment 7 includes a transparent substrate 2, a plurality of gate lines, a plurality of signal lines intersecting the gate lines, switching elements disposed at intersections of the gate lines and the signal lines, counter electrodes 42 connected to the switching elements, an electron transport layer 7, a light emitting layer 6, and a hole transport layer 43 which form each of organic layers 10 stacked on the counter pixel electrodes 42, respectively, conductive transparent pixel electrodes 3 formed on the organic films of the organic layers 10 so as to be opposed to the counter pixel electrodes 42, respectively, a protective layer 9 formed to directly or indirectly cover at least the organic layers 10, and a heat dissipating layer 11 formed to be in contact with the protective layer 9. In the organic layer 10, the electron transport layer 7, the light emitting layer 6, and the hole transport layer 43 are formed from the side near the transparent pixel electrode 3.

The switching element is preferably a TFT element, an MIM element, or the like that can control ON/OFF of the current. The TFT element is preferable in terms of controllability of the brightness of the organic EL element.

Although it differs depending on a specification of a display device, a known amorphous TFT or polysilicon TFT can be suitably used as the TFT element.

Next, description will be made as regards a method of manufacturing the active matrix organic EL display device according to Embodiment 7. At first, Al was formed into a 300 nm film by sputtering on a cleaned glass substrate. In the sputtering, an Ar, Kr, or Xe gas can be suitably used. When Xe is used, since the electron collision sectional area is large and the electron temperature is low, damage by a plasma to the formed Al film is suppressed, which is thus more preferable. Then, the formed Al film was patterned into gate lines and gate electrodes 24 by a photolithography method. Then, using the dual shower plate microwave plasma film forming apparatus used in Embodiment 1, silicon nitride was formed into a 300 nm film at a substrate temperature of 200° C. and at $Ar:N_2:H_2:SiH_4=80:18:1.5:0.5$, thereby obtaining a gate insulating film 23. By setting the substrate temperature to 200° C., it was possible to form a high-quality silicon nitride film having a high withstand voltage and a small interface state density and thus capable of being used as the gate insulating film 23. Then, using the same apparatus, amorphous silicon was formed into a 50 nm film at a substrate temperature of 200° C. and at a volume ratio of $Ar:SiH_4=95:5$ and, subsequently, n+ amorphous silicon was formed into a 30 nm film at $Ar:SiH_4:PH_3=94:5:1$. By patterning the stacked amorphous silicon and n+ silicon films by a photolithography method, element regions were formed. Then, using the same method as that shown in Embodiment 1, Al was formed into a film using a Xe plasma so as not to damage the elements and then was patterned by a photolithography method, thereby obtaining signal lines, signal line electrodes 39, and conductive transparent pixel electrodes 3. Then, using the patterned Al film as a mask, the n+ amorphous silicon layer was etched by a known ion etching method, thereby forming TFT channel separating regions. Using the dual shower plate microwave plasma film forming apparatus used in Embodiment 1, a silicon nitride film was formed at room temperature, and then was subjected to patterning of organic EL element regions by a photolithography method, thereby obtaining a protective film forming a protective layer 9 at each of the TFT channel separating portions and an insulating layer adapted to prevent a short between a conductive transparent electrode 3 and the counter pixel electrode 42 of each organic EL element. Then, using the method described in Embodiment 1, electron transport, light emitting, and hole transport layers 7, 6, and 43 were continuously formed and, without exposure to the atmosphere, an ITO containing 5 wt % Hf was formed into a 150 nm film by the method described in Embodiment 1, thereby obtaining the conductive transparent electrodes 3. Then, silicon nitride was formed into a 50 nm film at room temperature by the dual shower plate microwave plasma film forming apparatus used in Embodiment 1, thereby obtaining a protective layer 9. Since the protective layer 9 has a high thermal conductivity of 80 W/(m·K) and is sufficiently thin, the thermal resistance is small and, therefore, it can also fully serve as a heat dissipating layer 11 alone. However, the heat dissipating layer 11 may also be provided separately for carrying out heat dissipation more efficiently. There is no particular limitation to a material of the transparent heat dissipating layer used in the top emission type as long as it has a high thermal conductivity and is transparent, and an ITO or the like is cited as an example.

According to the top emission type active matrix organic EL display device thus obtained, since a buffer layer or a hole injection layer becomes unnecessary because of a high work function possessed by the Hf-containing ITO film, highly efficient light emission is enabled. Further, since use is made of the protective layer 9 having a high thermal conductivity and being thin, the protective layer 9 can suppress temperature rise of the elements while fully achieving its function as a protective layer, so that the element lifetime can be significantly improved. As a result of measuring the luminance half-decay lifetime of the display device shown in this Embodiment, it was improved to 9000 hours while being conventionally 3000 hours.

Embodiment 8

Figure 9B:
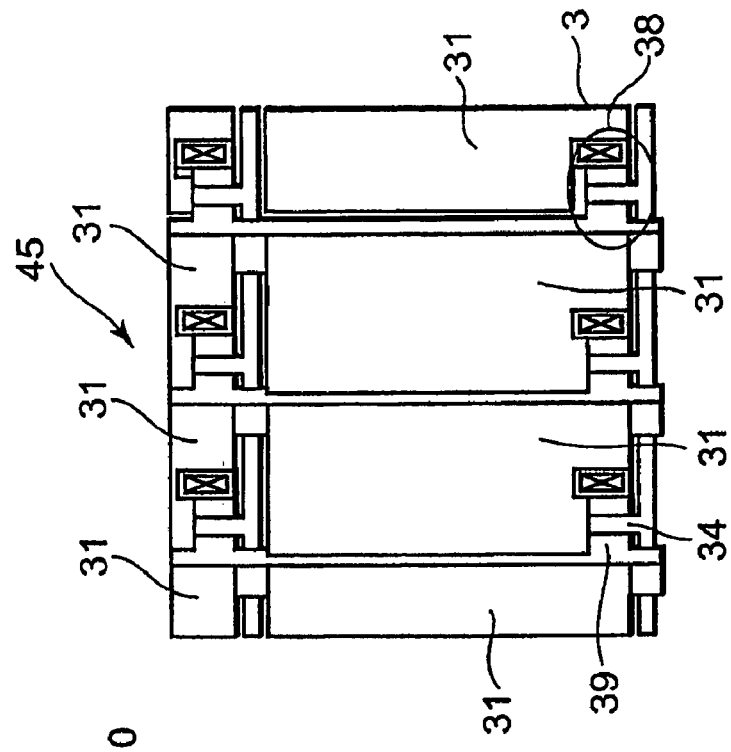
FIG. 9B is a plan view showing part of the organic EL display device of FIG. 9A.
Figure 9A:
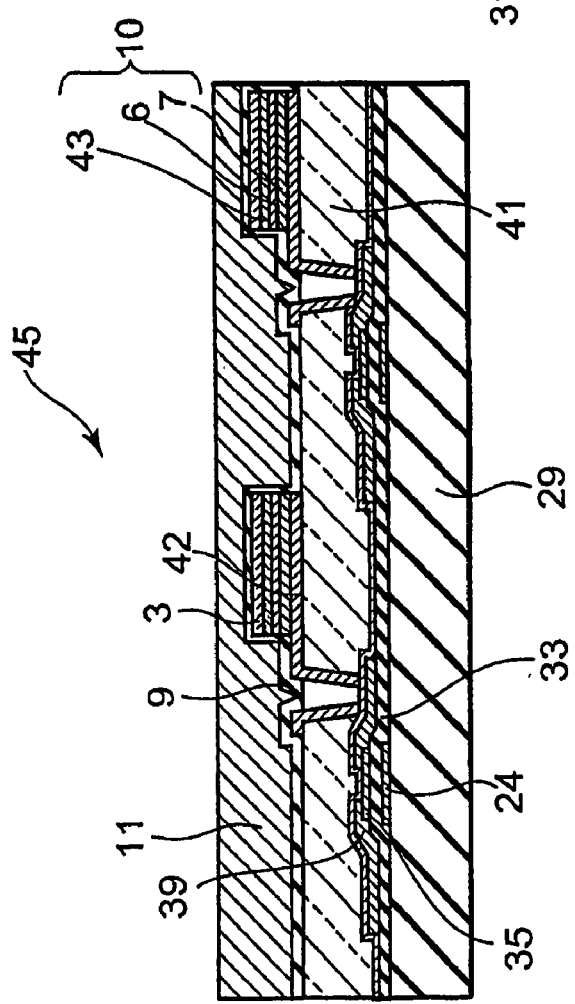
FIG. 9A is a sectional view showing part of an organic EL display device according to Embodiment 8 of this invention.

Referring to FIGS. 9A and 9B, a transparent flattening film 41 may be formed on TFTs and, thereafter, organic EL elements may be formed. With this configuration, the organic EL elements can be formed on a flat surface and, therefore, the manufacturing yield is improved. Further, since an organic EL layer is formed at a layer different from a signal line layer, pixel electrodes can be arranged so as to extend over the signal wiring and thus it is possible to increase an area of each light emitting element. Further, since signal lines can be formed of a material different from that of the pixel electrodes, it is not necessary to use a conductive transparent material and, therefore, it is possible to reduce a wiring resistance when a display device is increased in size, thereby enabling an increase in display gradation. A top emission type active matrix organic EL display device of Embodiment 8 is formed in the following manner. At first, gate lines, TFT elements, and signal lines were formed by the method described in Embodiment 7. The signal lines were obtained by forming Al into a 300 nm film by the sputtering method using a Xe gas as shown in Embodiment 6 and patterning it by a photolithography method. Then, a photosensitive transparent resin was coated by a spin coating method, then was subjected to exposure and development, and then was dried at 150° C. for 30 minutes, thereby obtaining a flattening film 41. By the foregoing exposure and development processes, the flattening film was formed with connecting holes each for connection between a pixel-side electrode of the TFT and an organic EL element. As the photosensitive transparent resin, there is an acrylic resin, a polyolefin resin, an alicyclic olefin resin, or the like. The alicyclic olefin resin is excellent in transparency with less moisture content and release and thus is preferable and, in this Embodiment, the alicyclic olefin resin was used. Then, using the method described in Embodiment 1, Al was formed into a film by the sputtering method using a Xe plasma and then was patterned by a photolithography method, thereby obtaining counter electrodes 42. Subsequently, electron transport, light emitting, and hole transport layers 7, 6, and 43 were continuously formed by the method shown in Embodiment 1, and then, using the method likewise shown in Embodiment 1, an ITO film containing 5 wt % Hf was formed and then was patterned by a photolithography method, thereby obtaining conductive transparent pixel electrodes 3. In the light emitting layer 6, materials adapted to emit light in red, green, and blue, respectively, may be used by optionally stacking them in layers or may be formed into single layers, respectively, and arranged in a matrix. Then, using the method shown in Embodiment 1, a silicon nitride film was deposited to 50 nm, thereby obtaining a protective film forming a protective layer 9. Since the silicon nitride film has a high thermal conductivity and is formed sufficiently thin, it servers as the protective layer 11 that also serves as a heat dissipating layer 11 even in this state. However, the heat dissipating layer 11 may also be provided separately for carrying out heat dissipation more efficiently. There is no particular limitation to a material of the transparent heat dissipating layer 11 used in the top emission type as long as it has a high thermal conductivity and is transparent, and an ITO or the like is cited as an example.

As a result of measuring the luminance half-decay lifetime of the display device thus obtained, the lifetime increased to 9000 hours while being conventionally 3000 hours and, further, the light emitting area increased to an element area ratio of 80% while being conventionally 60% and thus the surface brightness increased by 20%. Since the organic layers 10 were formed on the flattening film 41, there was no occurrence of film formation failure or the like and thus the manufacturing yield was improved.

Embodiment 9

Referring to FIGS. 10A and 10B, a bottom emission type active matrix organic EL display device 46 according to Embodiment 9 includes a transparent substrate 2, a plurality of gate lines, a plurality of signal lines intersecting the gate lines, switching elements disposed at intersections of the gate lines and the signal lines, conductive transparent pixel electrodes 36 connected to the switching elements, a hole transport layer 5, a light emitting layer 6, and an electron transport layer 5 which form each of organic layers 10 stacked on the transparent pixel electrodes 36, respectively, counter electrodes 8 formed on the organic films of the organic layers 10 so as to be opposed to the conductive transparent pixel electrodes 36, respectively, a protective layer 9 formed to directly or indirectly cover at least the organic layers 10, and a heat dissipating layer 11 formed to be in contact with the protective layer 9. In the organic layer 10, the hole transport layer 5, the light emitting layer 6, and the electron transport layer 7 are formed from the side near the transparent pixel electrode 36.

The switching element is preferably a TFT element, an MIM element, or the like that can control ON/OFF of the current. The TFT element is preferable in terms of controllability of the brightness of the organic EL element.

Although it differs depending on a specification of a display device, a known amorphous TFT or polysilicon TFT can be suitably used as the TFT element.

Next, description will be made as regards a method of manufacturing the active matrix organic EL display device 46 according to Embodiment 9. At first, using the dual shower plate microwave-excited plasma film forming apparatus used in Embodiment 1, polysilicon was formed into a 50 nm film on a cleaned glass substrate at a substrate temperature of 200° C. and at a volume ratio of $Ar:SiH_4=95:5$ while applying a high frequency of 13.56 MHz from the substrate and performing ion irradiation and then was patterned by a photolithography method, thereby obtaining TFT element regions. Then, using the same apparatus, silicon nitride was formed into a 300 nm film at a substrate temperature of 200° C. and at $Ar:N_2:H_2:SiH_4=80:18:1.5:0.5$, thereby obtaining a gate insulating film 33. By setting the substrate temperature to 200° C., it was possible to form a high-quality silicon nitride film having a high withstand voltage and a small interface state density and thus capable of being used as the gate insulating film 33. Subsequently, Al was formed into a 300 nm film by sputtering. In the sputtering, an Ar, Kr, or Xe gas can be suitably used. When Xe is used, since the electron collision sectional area is large and the electron temperature is low, damage by a plasma to the formed Al film is suppressed, which is thus more preferable. Then, the formed Al film was patterned into gate lines and gate electrodes by a photolithography method. Then, using the dual shower plate microwave plasma film forming apparatus used in Embodiment 1, silicon nitride was formed into a 300 nm film at a substrate temperature of 200° C. and at $Ar:N_2:H_2:SiH_4=80:18:1.5:0.5$. The formed silicon nitride film was formed with contact holes by a photolithography method. Then, using the same method as that shown in Embodiment 1, an ITO containing 5 wt % Hf was formed into a 350 nm film and then was patterned by a photolithography method, thereby obtaining signal lines, signal line electrodes 29, and conductive transparent pixel electrodes 36. Then, using the method described in Embodiment 1, hole transport, light emitting, and electron transport layers 5, 6, and 7 were continuously formed as organic layers 10 and, without exposure to the atmosphere, Al was formed into a film using a Xe plasma with a low electron temperature by the use of the Al sputtering apparatus used for the formation of the gate lines, thereby obtaining counter electrodes 8. Then, silicon nitride was formed into a 50 nm film at room temperature by the dual shower plate microwave plasma film forming apparatus used in Embodiment 1, thereby obtaining a protective layer 9. Since the protective layer 9 has a high thermal conductivity of 80 W/(m·K) and is sufficiently thin, the thermal resistance is small and, therefore, it can also fully serve as a heat dissipating layer alone. However, a heat dissipating layer 11 may also be provided separately for carrying out heat dissipation more efficiently. In this Embodiment, Al was formed into a film using a Xe plasma with a low electron temperature by the use of the Al sputtering apparatus used for the formation of the gate lines, thereby obtaining the heat dissipating layer 11.

According to the bottom emission type active matrix organic EL display device thus obtained, since a buffer layer or a hole injection layer becomes unnecessary because of a high work function possessed by the Hf-containing ITO film, highly efficient light emission is enabled. Further, since polysilicon is used as the TFT elements, the current drive performance is improved and thus the controllability of the organic EL elements is excellent, thereby enabling high-quality display. Further, since use is made of the protective layer 9 having a high thermal conductivity and being thin, the protective layer 9 can suppress temperature rise of the elements while fully achieving its function as a protective layer, so that the element lifetime can be significantly improved. As a result of measuring the luminance half-decay lifetime of the display device shown in this Embodiment, it was improved to 6000 hours while being conventionally 2000 hours.

Embodiment 10

As shown in FIGS. 11A and 11B, a flattening film 41 may be formed on TFTs and, thereafter, organic EL elements may be formed. With this configuration, the organic EL elements can be formed on a flat surface and, therefore, the manufacturing yield is improved. Further, since an organic EL layer is formed at a layer different from a signal line layer, pixel electrodes 36 can be arranged so as to extend over the signal wiring and thus it is possible to increase an area of each light emitting element. Further, since signal lines can be formed of a material different from that of the pixel electrodes 36, it is not necessary to use a conductive transparent material and, therefore, it is possible to reduce a wiring resistance when a display device is increased in size, thereby enabling an increase in display gradation.

A bottom emission type active matrix organic EL display device 48 of Embodiment 10 is formed in the following manner. At first, TFT elements, gate lines, and signal lines were formed by the method described in Embodiment 9. The signal lines were obtained by forming Al into a 300 nm film by the sputtering method using a Xe gas as shown in Embodiment 6 and patterning it by a photolithography method. Then, a photosensitive transparent resin was coated by a spin coating method, then was subjected to exposure and development, and then was dried at 150° C. for 30 minutes, thereby obtaining a flattening film 41. By the foregoing exposure and development processes, the flattening film was formed with connecting holes each for connection between a pixel-side electrode of the TFT and an organic EL element. As the photosensitive transparent resin, there is an acrylic resin, a polyolefin resin, an alicyclic olefin resin, or the like. The alicyclic olefin resin is excellent in transparency with less moisture content and release and thus is preferable and, in this Embodiment, the alicyclic olefin resin was used.

Then, using the method described in Embodiment 1, an ITO film containing 5 wt % Hf was formed and then was patterned by a photolithography method, thereby obtaining conductive transparent pixel electrodes 36. Subsequently, hole transport, light emitting, and electron transport layers 5, 6, and 7 were continuously formed by the method shown in Embodiment 1, and then Al was formed into a film by the sputtering method using a Xe plasma, which is likewise shown in Embodiment 1, thereby obtaining counter electrodes 8. In the light emitting layer 6, materials adapted to emit light in red, green, and blue, respectively, may be used by optionally stacking them in layers or may be formed into single layers, respectively, and arranged in a matrix. Then, using the method shown in Embodiment 1, a silicon nitride film was deposited to 50 nm, thereby forming a protective film. Since the silicon nitride film has a high thermal conductivity and is formed sufficiently thin, it servers as the protective layer 9 that also serves as a heat dissipating layer 11 even in this state. However, for carrying out heat dissipation more efficiently, Al was deposited by the sputtering method using a Xe plasma, which is shown in Embodiment 1, thereby obtaining the heat dissipating layer 11.

As a result of measuring the luminance half-decay lifetime of the display device thus obtained, the lifetime increased to 6000 hours while being conventionally 2000 hours and, further, the light emitting area increased to an element area ratio of 80% while being conventionally 60% and thus the surface brightness increased by 20%. Since the organic layers 10 were formed on the flattening film 41, there was no occurrence of film formation failure or the like and thus the manufacturing yield was improved. Further, since polysilicon is used as the TFT elements, the current drive performance is improved and thus the controllability of the organic EL elements is excellent, thereby enabling high-quality display.

Embodiment 11

In the bottom emission type active matrix display device shown in Embodiment 9, by changing the formation order between the counter electrode 42 and the conductive transparent electrode 3 and the formation order between the electron transport layer 7 and the hole transport layer according to the same method as that shown in Embodiment 7, it is possible to obtain a top emission type active matrix display device 50.

Figure 12B:
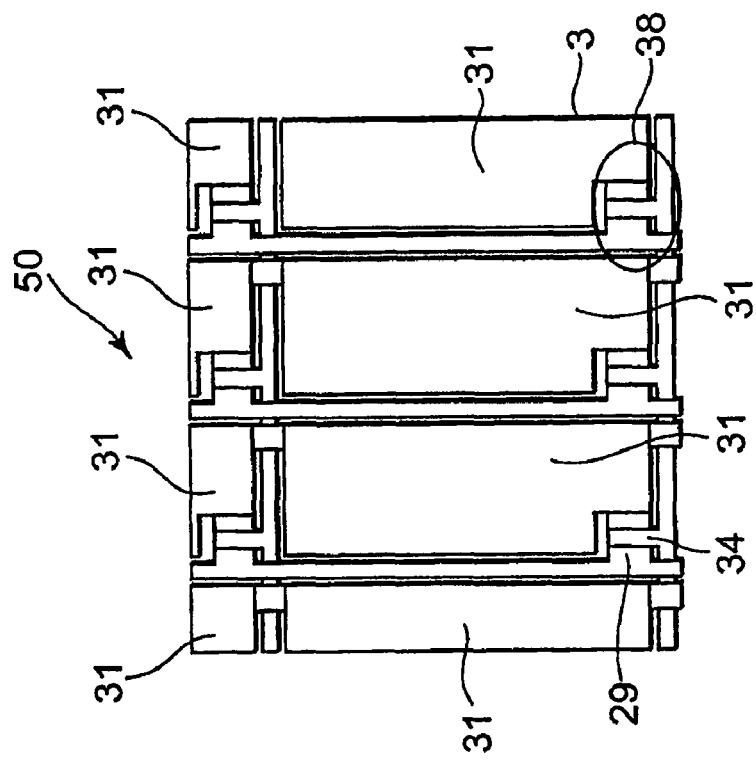
FIG. 12B is a plan view showing part of the organic EL display device of FIG. 12A.
Figure 12A:
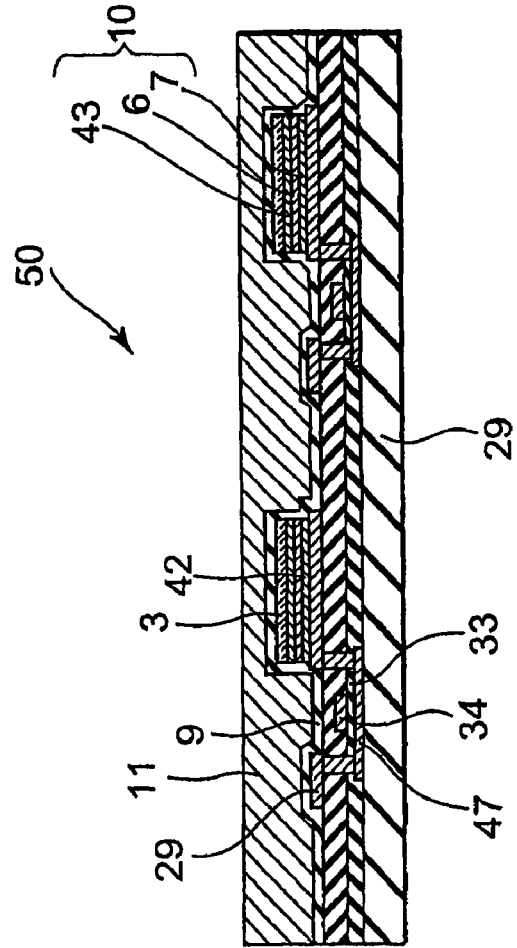
FIG. 12A is a sectional view showing part of an organic EL display device according to Embodiment 11 of this invention.

Referring to FIGS. 12A and 12B, in the top emission type active matrix display device thus formed, although a substrate 29 is not limited as long as its surface is insulative, use was made of a metal substrate formed with a silicon nitride film on the surface thereof. As TFT elements, use was made of polysilicon TFTs shown in Embodiment 10.

According to the bottom emission type active matrix organic EL display device 50 thus obtained, since a buffer layer or a hole injection layer becomes unnecessary because of a high work function possessed by the Hf-containing ITO film, highly efficient light emission is enabled. Further, since polysilicon is used as the TFT elements, the current drive performance is improved and thus the controllability of the organic EL elements is excellent, thereby enabling high-quality display. Further, since use is made of the protective layer 9 having a high thermal conductivity and being thin, the protective layer 9 can suppress temperature rise of the elements while fully achieving its function as a protective layer, so that the element lifetime can be significantly improved. As a result of measuring the luminance half-decay lifetime of the display device shown in this Embodiment, it was improved to 9000 hours while being conventionally 3000 hours.

Embodiment 12

In the bottom emission type active matrix display device shown in Embodiment 10, by changing the formation order between the counter electrode and the conductive transparent electrode and the formation order between the electron transport layer and the hole transport layer according to the same method as that shown in Embodiment 8, it is possible to obtain a top emission type active matrix display device.

Figure 13B:
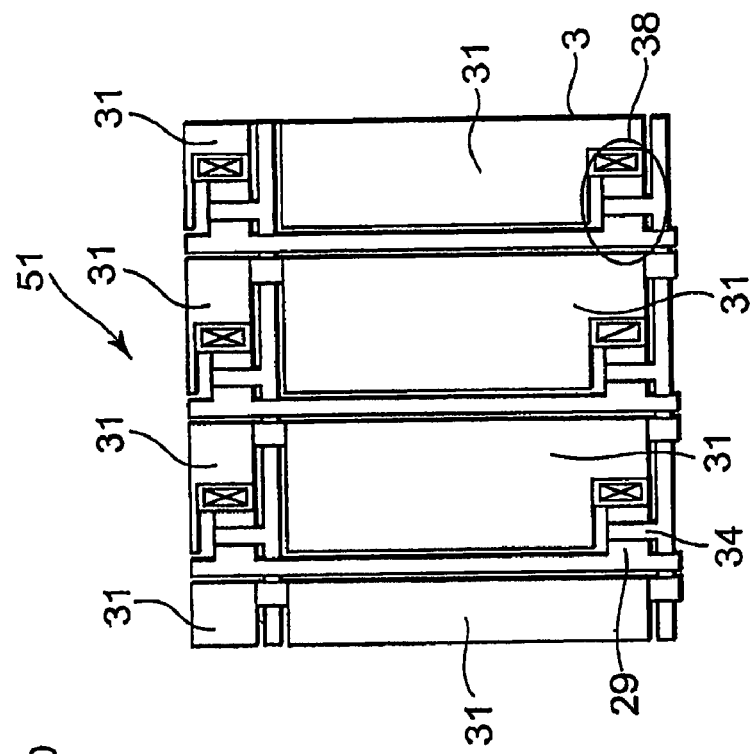
FIG. 13B is a plan view showing part of the organic EL display device of FIG. 13A.
Figure 13A:
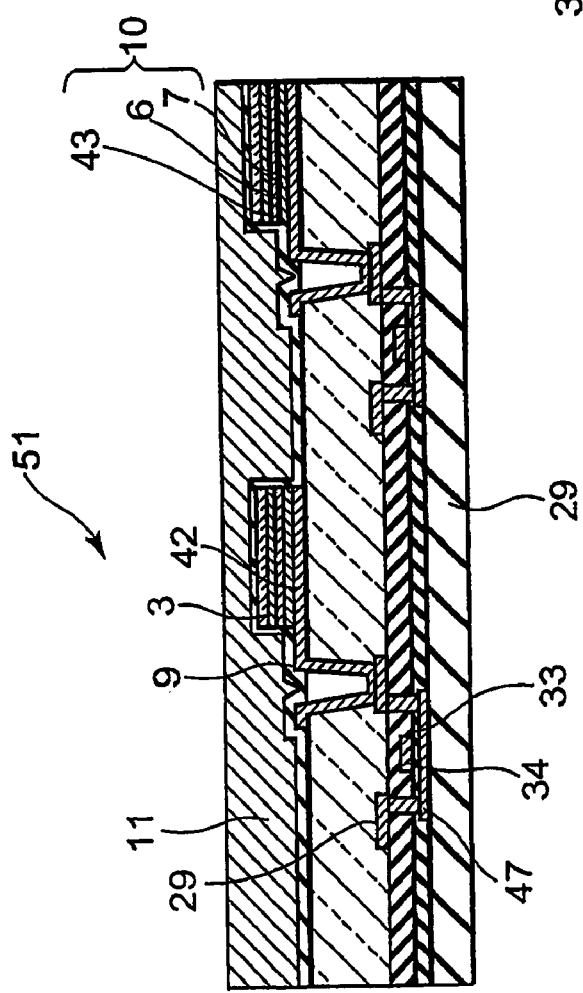
FIG. 13A is a sectional view showing part of an organic EL display device according to Embodiment 12 of this invention.

Referring to FIGS. 13A and 13B, in the top emission type active matrix display device thus formed, although a substrate 29 is not limited as long as its surface is insulative, use was made of a metal substrate formed with a silicon nitride film on the surface thereof. As TFT elements, use was made of polysilicon TFTs shown in Embodiment 11.

According to the bottom emission type active matrix organic EL display device 51 thus obtained, since a buffer layer or a hole injection layer becomes unnecessary because of a high work function possessed by the Hf-containing ITO film, highly efficient light emission is enabled. Further, since polysilicon is used as the TFT elements, the current drive performance is improved and thus the controllability of the organic EL elements is excellent, thereby enabling high-quality display. Further, since use is made of the protective layer 9 having a high thermal conductivity and being thin, the protective layer 9 can suppress temperature rise of the elements while fully achieving its function as a protective layer, so that the element lifetime can be significantly improved. As a result of measuring the luminance half-decay lifetime of the display device shown in this Embodiment, it was improved to 9000 hours while being conventionally 3000 hours. Further, the light emitting area increased to an element area ratio of 80% while being conventionally 60% and thus the surface brightness increased by 20%. Further, since the organic layers 10 were formed on the flattening film 41, there was no occurrence of film formation failure or the like and thus the manufacturing yield was improved.

Embodiment 13

Figure 14A:
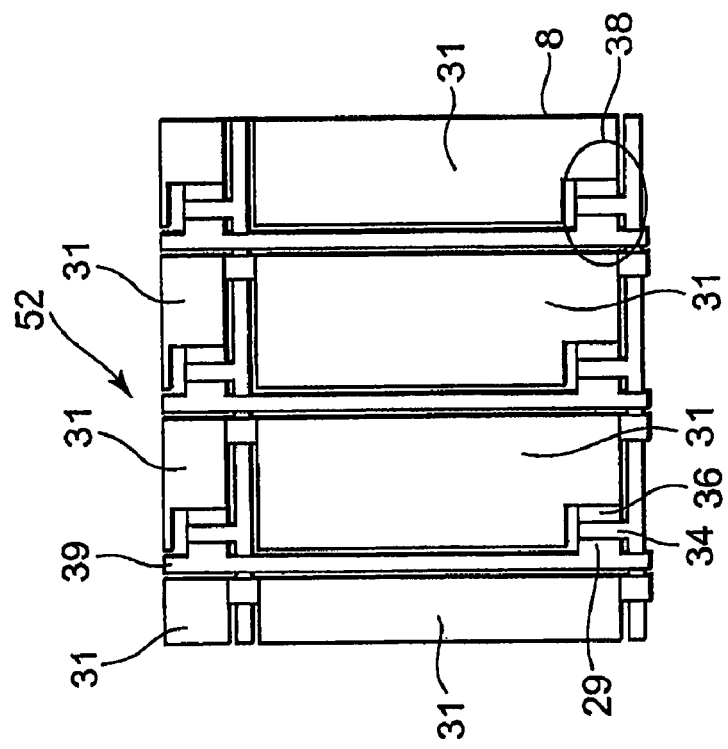
FIG. 14A is a sectional view showing part of an organic EL display device according to Embodiment 13 of this invention.
Figure 14B:
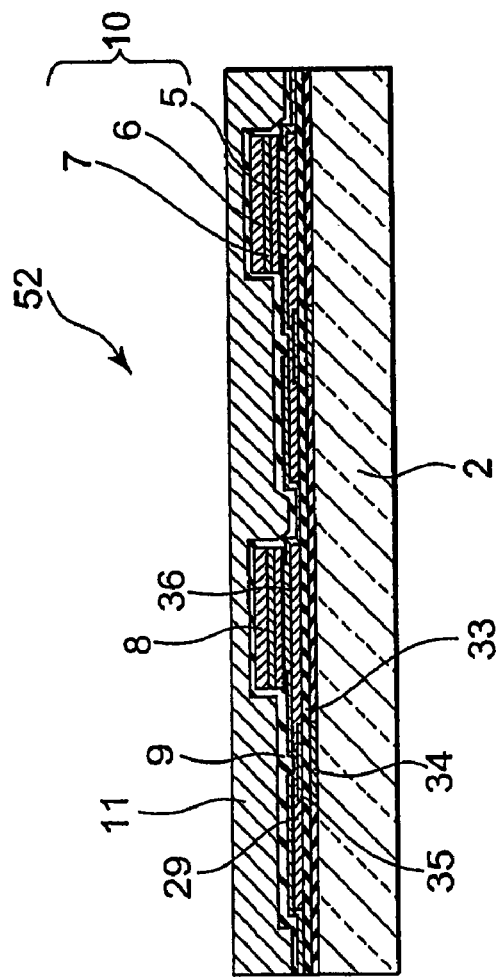
FIG. 14B is a plan view showing part of the organic EL display device of FIG. 14A.

Referring to FIGS. 14 and 14B, a bottom emission type organic EL display device 52 according to Embodiment 13 includes a transparent substrate 2, a plurality of gate lines, a plurality of signal lines intersecting the gate lines, switching elements disposed at intersections of the gate lines and the signal lines, conductive transparent pixel electrodes 36 connected to the switching elements, a hole transport layer 5, a light emitting layer 6, and an electron transport layer 7 which form each of organic layers 10 stacked on the transparent pixel electrodes 36, respectively, counter electrodes 8 formed on the organic films of the organic layers 10 so as to be opposed to the transparent pixel electrodes 36, respectively, a protective layer 9 formed to directly or indirectly cover at least the organic layers 10, and a heat dissipating layer 11 formed to be in contact with the protective layer 9. In the organic layer 10, the hole transport layer 5, the light emitting layer 6, and the electron transport layer 7 are formed from the side near the transparent pixel electrode 36.

The TFT elements and the display device of this Embodiment are formed in the following manner. At first, a photosensitive transparent resin is coated to 350 nm on a cleaned substrate and then is exposed and developed, thereby forming openings in gate line and gate electrode regions. Then, a metal film is formed in the openings to a thickness equal to that of the photosensitive transparent resin by a screen printing method, an injection printing method, a plating method, or the like, thereby obtaining gate lines and gate electrodes 34. While a material of the metal film can be properly selected depending on a manufacturing method, Au, Cu, Ag, Al or the like having a low resistivity is preferable. In this Embodiment, Ag was selected as a wiring material. Then, using the dual shower plate microwave plasma film forming apparatus used in Embodiment 1, silicon nitride was formed into a 300 nm film at a substrate temperature of 200° C. and at $Ar:N_2:H_2:SiH_4=80:18:1.5:0.5$, thereby obtaining a gate insulating film 33. By setting the substrate temperature to 200° C., it was possible to form a high-quality silicon nitride film having a high withstand voltage and a small interface state density and thus capable of being used as a gate insulating film. Then, using the same apparatus, amorphous silicon was formed into a 50 nm film at a substrate temperature of 200° C. and at a volume ratio of $Ar:SiH_4=95:5$ and, subsequently, n+ amorphous silicon was formed into a 30 nm film at $Ar:SiH_4:PH_3=94:5:1$. By patterning the stacked amorphous silicon and n+ silicon films by a photolithography method, element regions were formed. Then, using the same method as that shown in Embodiment 1, an ITO containing 5 wt % Hf was formed into a 350 nm film and then was patterned by a photolithography method, thereby obtaining signal lines, signal line electrodes 29, and conductive transparent pixel electrodes 36. Then, using the patterned ITO film as a mask, the n+ amorphous silicon layer was etched by a known ion etching method, thereby forming TFT channel separating regions. Using the dual shower plate microwave plasma film forming apparatus used in Embodiment 1, a silicon nitride film was formed at room temperature, and then was subjected to patterning of organic EL element regions by a photolithography method, thereby obtaining a protective film forming a protective layer 9 at each of the TFT channel separating portions and an insulating layer adapted to prevent a short between the conductive transparent electrode 36 and a counter electrode 8 of each organic EL element. Then, using the method described in Embodiment 1, hole transport, light emitting, and electron transport layers 5, 6, and 7 were continuously formed as organic layers 10 and, without exposure to the atmosphere, Al was formed into a film using a Xe plasma with a low electron temperature by the use of an Al sputtering apparatus used for the formation of the gate lines, thereby obtaining the counter electrodes 8. Then, silicon nitride was formed into a 50 nm film at room temperature by the dual shower plate microwave plasma film forming apparatus used in Embodiment 1, thereby obtaining a protective layer 9. Since the protective layer 9 has a high thermal conductivity of 80 W/(m·K) and is sufficiently thin, the thermal resistance is small and, therefore, it can also fully serve as a heat dissipating layer 11 alone. However, the heat dissipating layer 11 may also be provided separately for carrying out heat dissipation more efficiently. In this embodiment, Al was formed into a film using a Xe plasma with a low electron temperature by the use of the Al sputtering apparatus used for the formation of the gate lines, thereby obtaining the heat dissipating layer 11.

According to the bottom emission type active matrix organic EL display device thus obtained, since a buffer layer or a hole injection layer becomes unnecessary because of a high work function possessed by the Hf-containing ITO film, highly efficient light emission is enabled. Further, since use is made of the protective layer 9 having a high thermal conductivity and being thin, the protective layer 9 can suppress temperature rise of the elements while fully achieving its function as a protective layer, so that the element lifetime can be significantly improved. As a result of measuring the luminance half-decay lifetime of the display device shown in this Embodiment, it was improved to 6000 hours while being conventionally 2000 hours. Further, since it is configured such that the gate electrodes are embedded, the semiconductor layers forming the TFTs can be formed on a flat surface and thus it is possible to suppress current variation of the TFTs. Therefore, not only the display quality is improved, but also lifetime variation of the organic EL elements due to current variation can be suppressed.

A polysilicon layer may be used instead of the amorphous silicon layers according to the method shown in Embodiment 9. In this case, since the current drive performance of the TFTs is improved, the controllability of light emission of the organic EL elements is improved, thereby enabling an improvement in display quality.

Further, as shown in Embodiments 7 and 11, the top emission type structure may be employed by switching between the counter electrode 8 and the conductive transparent electrode 36 and between the electron transport layer 7 and the hole transport layer 5, respectively. In this case, it is possible to improve the efficiency of light extraction from the organic EL elements.

Further, as shown in Embodiments 6, 8, 10, and 12, it may be configured such that the flattening film 41 is formed on the TFTs and the organic EL elements are formed thereon. In this case, since the organic EL layers are formed on the flat surface, film formation failure or the like is suppressed. Therefore, the element lifetime is improved and, further, it becomes possible to suppress variation in brightness and variation in lifetime.

Embodiment 14

Figure 15:
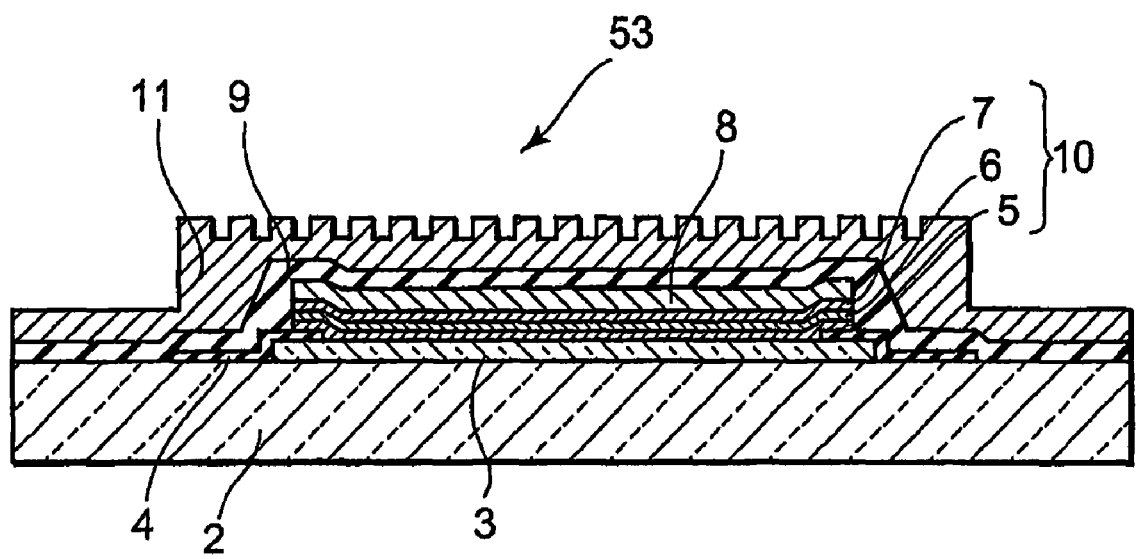
FIG. 15 is a sectional view showing one example of a heat dissipating layer according to Embodiment 14 of this invention.

Referring to FIG. 15, a heat dissipating layer 11 according to Embodiment 14 exemplifies the heat dissipating layer 11 of the display element in Embodiment 1. The heat dissipating layer 11 of this Embodiment has a comb-shaped pattern on its surface, thereby increasing an area contacting an external layer, for example, an air layer, to achieve an improvement in heat dissipation efficiency. With the configuration of this comb-shaped electrode, the heat dissipation efficiency was improved, so that the luminance half-decay lifetime of the element was improved by 20%. Although the comb-shaped structure is employed in this Embodiment, lands and recesses on an emboss or the like may be employed as long as it is a structure that can increase the contact area with an external layer. Further, the heat dissipating layer 11, when not serving as a protective layer 9, does not need to cover the entire surface of the element, but may cover at least a light emitting region. It may be configured such that adjacent heat dissipating layers are connected together and another heat dissipation means such as a heatsink or a Peltier element is provided outside the element.

Further, in the case of the top emission type, there may be provided lands and recesses of about several nm to several ten nm sufficiently shorter than a wavelength of light or there may be provided a matrix lattice shape with a height of several microns so as to match a shape of a black matrix. This can improve the heat dissipation effect by about several %.

As described above, according to the Embodiments of this invention, since the work function of ITO can be increased to about 5.5 eV by the Hf-containing ITO film, the hole injection efficiency in the organic EL element is improved to thereby make unnecessary a hole injection layer or a buffer layer that is generally required and, therefore, the light emitting efficiency is improved, thereby enabling an improvement in brightness. Further, the calorific value is reduced by a reduction in energy barrier to the light emitting layer, so that the lifetime of the organic EL element can be improved.

Further, according to this invention, since a nitride is used as a protective layer of an organic EL light emitting layer, it is possible to obtain a stable protective layer with a high thermal conductivity and with no permeation of moisture or an oxidizing gas even in the form of a thin film. Since the heat generated in the light emitting layer can be efficiently released to the outside, the lifetime of an organic EL element can be improved. According to a display element of this invention, since a nitride protective film is formed by low-temperature vapor deposition, it is possible to prevent damage to an organic EL layer. Further, according to a display element of this invention, since an organic EL element can be formed on a flat structure, film formation failure or the like is reduced, so that the lifetime of the element can be improved. Further, according to a display element of this invention, since an organic EL electrode and a signal line can be arranged at different wiring layers, a display area can be increased to thereby enable an improvement in screen brightness. Further, according to a display element of this invention, since an organic EL electrode and a signal line can be arranged at different wiring layers, the signal line and the electrode of the organic EL element can include different materials and, therefore, an electrical resistance of the signal line can be reduced, so that a large-size display device can be configured. Further, according to a display device of this invention, since embedded gate structure TFTs can be used, semiconductor regions of the TFT elements can be configured to be substantially flat, thereby enabling a reduction in current variation of the TFT elements. Accordingly, it is possible to suppress variation in lifetime of organic EL elements while realizing high-quality display.

INDUSTRIAL APPLICABILITY

As described above, an organic EL light emitting element according to this invention is most suitable for a liquid crystal display device, a monitor of a television, or the like.

The invention claimed is:

1. A method of manufacturing a light emitting element, said light emitting element comprising a conductive transparent electrode, a counter electrode opposed to said conductive transparent electrode, a light emitting layer provided between said conductive transparent electrode and said counter electrode, and a protective layer provided to cover at least said light emitting element, said method comprising a step of forming the protective layer, wherein the step of forming said protective layer comprises a step of forming a silicon nitride film by low-temperature vapor deposition using a microwave-excited plasma, and a thickness of the silicon nitride film is 10 nm or more and 100 nm or less.

2. The method according to claim 1, wherein the step of forming the silicon nitride film is performed in a dual shower plate microwave-excited high-density plasma film forming apparatus.

3. A light emitting element manufactured by the method according to claim 1.

* * * * *